United States Patent
Do et al.

(10) Patent No.: US 9,799,589 B2
(45) Date of Patent: Oct. 24, 2017

(54) INTEGRATED CIRCUIT PACKAGING SYSTEM WITH A GRID ARRAY WITH A LEADFRAME AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Pte. Ltd., Singapore (SG)

(*) Notice: Subject to any disclaimer, the term of this patent is extended or adjusted under 35 U.S.C. 154(b) by 379 days.

(21) Appl. No.: 13/428,251

(22) Filed: Mar. 23, 2012

(65) Prior Publication Data

US 2013/0249118 A1 Sep. 26, 2013

(51) Int. Cl.
*H01L 23/48* (2006.01)
*H01L 23/52* (2006.01)
(Continued)

(52) U.S. Cl.
CPC .. *H01L 23/49816* (2013.01); *H01L 23/49827* (2013.01); *H01L 23/49833* (2013.01); *H01L 23/49861* (2013.01); *H01L 25/0657* (2013.01); *H01L 25/105* (2013.01); *H01L 21/4828* (2013.01); *H01L 24/16* (2013.01); *H01L 24/29* (2013.01); *H01L 24/32* (2013.01); *H01L 24/48* (2013.01); *H01L 24/81* (2013.01); *H01L 24/96* (2013.01); *H01L 2224/16245* (2013.01); *H01L 2224/2919* (2013.01); *H01L 2224/32225* (2013.01); *H01L 2224/48091* (2013.01); *H01L 2224/48177* (2013.01); *H01L 2224/73265* (2013.01); *H01L 2224/81191* (2013.01); *H01L 2224/81815* (2013.01); *H01L 2224/8385* (2013.01); *H01L 2224/96* (2013.01); *H01L 2225/0651* (2013.01); *H01L 2225/06517* (2013.01); *H01L 2225/06572* (2013.01); *H01L 2225/1029* (2013.01); *H01L 2225/1058* (2013.01); *H01L 2924/00014* (2013.01);
(Continued)

(58) Field of Classification Search
CPC ..... H01L 23/49582; H01L 2225/06513; H01L 2225/06517; H01L 24/01; H01L 24/14; H01L 2924/14; H01L 23/49816; H01L 23/49827; H01L 23/49861; H01L 25/0657; H01L 23/522; H01L 23/5221; H01L 23/5226
USPC ....... 257/690, 678, 666, 676, 777, 778, 737, 257/738, 782, 779, 780, 781, 783, 786, 257/787, 790, 692, 693, 673, 734, 788, 257/792, 793; 438/106, 108, 111, 112, 438/118, 123, 127
See application file for complete search history.

(56) References Cited

U.S. PATENT DOCUMENTS 5,656,550 A * 8/1997 Tsuji et al. ............... 438/123
6,828,220 B2  12/2004 Pendse et al.
(Continued)

*Primary Examiner* — Thanh Y Tran
(74) *Attorney, Agent, or Firm* — Wong & Rees LLP

(57) ABSTRACT

A method of manufacture of an integrated circuit packaging system includes: forming a conductive trace having a terminal end and a circuit end; forming a terminal on the terminal end; connecting an integrated circuit die directly on the circuit end of the conductive trace, the integrated circuit die laterally offset from the terminal, the active side of the integrated circuit die facing the circuit end; and forming an insulation layer on the terminal and the integrated circuit die, the integrated circuit die covered by the insulation layer.

20 Claims, 8 Drawing Sheets

(51) Int. Cl.
*H01L 29/40* (2006.01)
*H01L 23/498* (2006.01)
*H01L 25/065* (2006.01)
*H01L 25/10* (2006.01)
*H01L 21/48* (2006.01)
*H01L 23/00* (2006.01)

(52) U.S. Cl.
CPC .............. *H01L 2924/12042* (2013.01); *H01L 2924/16152* (2013.01); *H01L 2924/181* (2013.01)

(56) References Cited

U.S. PATENT DOCUMENTS

| | | | |
|---|---|---|---|
| 2008/0251940 A1* | 10/2008 | Lee et al. | 257/777 |
| 2009/0224391 A1* | 9/2009 | Lin | H01L 21/6835 257/690 |
| 2009/0230523 A1* | 9/2009 | Chien et al. | 257/676 |
| 2009/0236686 A1* | 9/2009 | Shim et al. | 257/528 |
| 2009/0309212 A1* | 12/2009 | Shim et al. | 257/700 |
| 2010/0140771 A1* | 6/2010 | Huang | H01L 21/6835 257/686 |
| 2010/0237495 A1* | 9/2010 | Pagaila | H01L 21/568 257/700 |
| 2011/0278707 A1* | 11/2011 | Chi et al. | 257/676 |
| 2012/0049334 A1* | 3/2012 | Pagaila et al. | 257/666 |
| 2012/0056314 A1* | 3/2012 | Pagaila et al. | 257/734 |
| 2012/0061822 A1* | 3/2012 | Pagaila | 257/737 |
| 2012/0104606 A1* | 5/2012 | Okuda et al. | 257/738 |
| 2012/0286407 A1* | 11/2012 | Choi | H01L 21/4853 257/670 |
| 2013/0037936 A1* | 2/2013 | Choi | H01L 21/565 257/737 |
| 2013/0069239 A1* | 3/2013 | Kim et al. | 257/774 |

* cited by examiner

INTEGRATED CIRCUIT PACKAGING SYSTEM WITH A GRID ARRAY WITH A LEADFRAME AND METHOD OF MANUFACTURE THEREOF

TECHNICAL FIELD

The present invention relates generally to an integrated circuit packaging system, and more particularly to a system for an integrated circuit packaging system with a grid array with a leadframe.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipment. Paradoxically, the reuse of existing manufacturing processes does not typically result in the reduction of package dimensions. The demand still exists for lower cost, smaller sizes and more functionality.

Thus, a need still remains for an integrated circuit packaging system produced at a lower cost, in smaller sizes, and with more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a conductive trace having a terminal end and a circuit end; forming a terminal on the terminal end; connecting an integrated circuit die directly on the circuit end of the conductive trace, the integrated circuit die laterally offset from the terminal, the active side of the integrated circuit die facing the circuit end; and forming an insulation layer on the terminal and the integrated circuit die, the integrated circuit die covered by the insulation layer.

The present invention provides an integrated circuit packaging system, including: a conductive trace having a terminal end and a circuit end; a terminal on the terminal end; an integrated circuit die directly on the circuit end of the conductive trace, the integrated circuit die laterally offset from the terminal, the active side of the integrated circuit die facing the circuit end; and an insulation layer on the terminal and the integrated circuit die, the integrated circuit die covered by the insulation layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
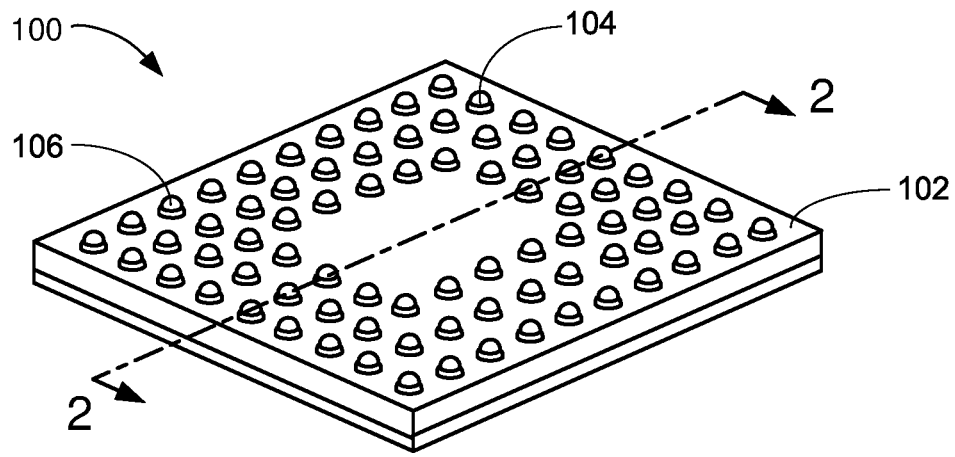
FIG. 1 is an isometric bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown an isometric bottom view of an integrated circuit packaging system 100 in a first embodiment of the present invention. The integrated circuit packaging system 100 is shown having an insulation layer 102, contact pads 104, and external interconnects 106, as an example.

The insulation layer 102 is defined as an electrically non-conductive layer made from various materials. For example, the insulation layer 102 can be made from materials such as a solder mask, a liquid crystal polymer (LCP), a molding compound, a polyimide, an epoxy, BT resin, or other resins.

An array of the contact pads 104 can be exposed from the insulation layer 102. The contact pads 104 can be formed from a conductive material such as gold, silver, nickel, palladium, tin, an alloy thereof, or a combination thereof resistant to etching.

An array of the external interconnects 106 can be attached to the contact pads 104. For example, the external interconnects 106 can be solder balls, solder bumps, stud bumps, conductive pillars, or a combination thereof. The external interconnects 106 can allow the integrated circuit packaging system 100 to connect to another device, circuit board, or system. The external interconnects 106 on the contact pads 104 are optional. Without the external interconnects 106, the integrated circuit packaging system 100 can form a land grid array (LGA) package (not shown).

Figure 2:
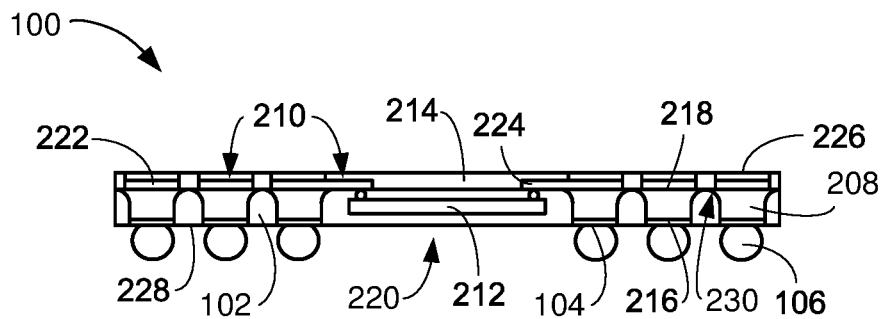
FIG. 2 is a cross-sectional view of the integrated circuit packaging system along the section line 2-2 of FIG. 1.

Referring now to FIG. 2, therein is shown a cross-sectional view of the integrated circuit packaging system 100 along the section line 2-2 of FIG. 1. The integrated circuit packaging system 100 is shown having terminals 208, conductive traces 210, an integrated circuit die 212, a package body 214, and the insulation layer 102, as an example.

The terminals 208 can contact the insulation layer 102 and have the contact pads 104 on an external terminal surface 216 of the terminals 208. The terminals 208, aligned horizontally with one another, can include an internal terminal surface 218 opposite the external terminal surface 216. The non-horizontal sides of the terminals 208 can have a curved or concave shape, characteristic of an etching process, and can be in direct contact with the insulation layer 102. The insulation layer 102 can electrically insulate the terminals 208 from each other.

The conductive traces 210 are defined as an electrically conductive structure for redistribution of signals. The conductive traces 210 can extend horizontally from the terminals 208 into a die mounting region 220 defined as an internal region of the integrated circuit packaging system 100 having circuitry, separated from, and aligned laterally with the terminals 208. For example, the conductive traces 210 can be a single layer of conductive plating.

The conductive traces 210 have terminal ends 222 directly on the internal terminal surface 218 of the terminals 208 and circuit ends 224 on the opposite end of the conductive traces 210. The conductive traces 210 can be formed from a conductive material such as gold, silver, nickel, palladium, tin, an alloy thereof, or a combination thereof resistant to etching. The entire length of the conductive traces 210 have identical and uniform physical and chemical properties throughout due to being formed from the same conductive material. The conductive traces 210 can be narrower between the terminal ends 222 and the circuit ends 224 for ease of routing, or can be the same size throughout.

Each of the circuit ends 224 can extend into the die mounting region 220 and can be directly on, attached, or connected to the integrated circuit die 212 in the die mounting region 220. The insulation layer 102 can directly cover a portion of the circuit ends 224 facing the integrated circuit die 212. For example, there can be rows of the circuit ends 224 arranged just inside the perimeter of the die mounting region 220.

The integrated circuit die 212 having interconnects, such as a flip chip, can be conformably covered by the insulation layer 102. The interconnects of the integrated circuit die 212 are in direct contact with only the circuit ends 224 and the insulation layer 102. The integrated circuit die 212 is laterally offset from the terminals 208 and located between the circuit ends 224 and a plane having the external terminal surface 216. A portion of the integrated circuit die 212 is directly under the circuit ends 224. The integrated circuit die 212 can be centrally located or offset within the die mounting region 220.

Stacking pads 226 formed of a conductive material are directly on the terminal ends 222. The stacking pads 226 can be exposed from the package body 214 on a side of the terminal ends 222 facing away from the integrated circuit die 212. The stacking pads 226 can be used to connect the integrated circuit packaging system 100 to any other device, including one that also has the stacking pads 226 for further stacking.

The package body 214 can be in direct contact with a portion of the insulation layer 102, the conductive traces 210, and the stacking pads 226. The package body 214 is defined as a cover that provides a hermetic seal protecting components from the outside environment. For example, the package body 214 can be a film assisted molding, epoxy molding, moldable underfill, encapsulation, or other protective molding. An internal surface of the package body 214 can have concave surfaces 230 between the terminals 208 characteristic of an etching process.

Peripheral sides of the insulation layer 102 can be coplanar with the peripheral non-horizontal sides of the package body 214. An external insulation surface 228 of the insulation layer 102 can be coplanar with the contact pads 104.

It has been discovered that the integrated circuit die 212 attached to and directly under the circuit ends 224, mounted between the circuit ends 224 and a plane having the external terminal surface 216, substantially reduces an overall height of the integrated circuit packaging system 100.

It has also been discovered that the integrated circuit die 212 being a flip chip rather than a wire-bond chip attached to and directly under the circuit ends 224 increases circuitry performance and manufacturing yield of the integrated circuit packaging system 100. For example, shorter distances for signals to travel can increase circuitry performance and avoiding the use of fragile bond wires can increase manufacturing yield by simplifying manufacturing processes.

It has been unexpectedly discovered that the integrated circuit die 212 having signals routed by the conductive traces 210 to an array of the terminals 208 increases the density of connections in the integrated circuit packaging system 100 without increasing the height and provides for selective routing of signals to any of the terminals 208.

In another embodiment of the present invention, the stacking pads 226 are not on the terminal ends 222. Without the stacking pads 226, the conductive traces 210 can be fully covered by the package body 214.

It has been discovered that covering the conductive traces 210 with the package body 214 without exposing any components through the package body 214 eliminates entry of any moisture or contaminants into the integrated circuit packaging system 100 under harsh environmental conditions. For example, differential rates of thermal expansion during rapid heating and cooling cycles will be less likely to breach the package body 214 or interior of the integrated circuit packaging system 100 and allow the entry of moisture or contaminants.

Figure 3:
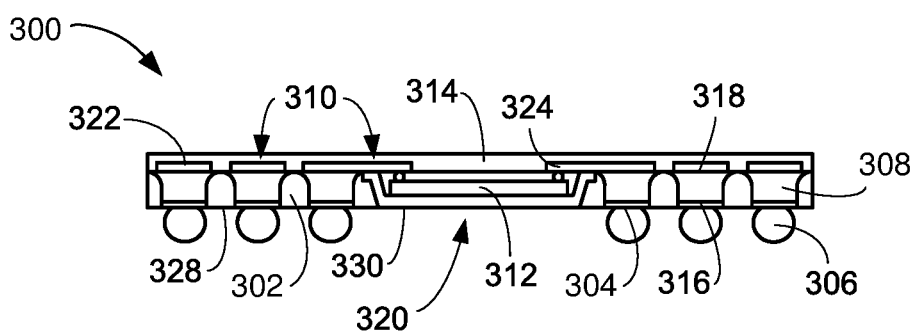
FIG. 3 is a cross-sectional view of the integrated circuit packaging system as exemplified by the isometric bottom view of FIG. 1 and along the section line 2-2 of FIG. 1 in a second embodiment of the present invention.

Referring now to FIG. 3, therein is shown a cross-sectional view of the integrated circuit packaging system 300 as exemplified by the isometric bottom view of FIG. 1 and along the section line 2-2 of FIG. 1 in a second embodiment of the present invention. The integrated circuit packaging system 300 is shown having terminals 308, conductive traces 310, an integrated circuit die 312, a package body 314, and an insulation layer 302, as an example.

The insulation layer 302 is defined as an electrically non-conductive layer. For example, the insulation layer 302 can be made from materials such as a solder mask, a liquid crystal polymer (LCP), a molding compound, a polyimide, an epoxy, BT resin, or other resins.

An array of the contact pads 304 can be exposed from the insulation layer 302. The contact pads 304 can be formed from a conductive material such as gold, silver, nickel, palladium, tin, an alloy thereof, or a combination thereof resistant to etching can be formed from a conductive material such as gold, silver, nickel, palladium, tin, an alloy thereof, or a combination thereof resistant to etching.

An array of the external interconnects 306 can be attached to the contact pads 304. For example, the external interconnects 306 can be solder balls, solder bumps, stud bumps, conductive pillars, or a combination thereof. The external interconnects 306 can allow the integrated circuit packaging system 300 to connect to another device, circuit board, or system. The external interconnects 306 on the contact pads 304 are optional. Without the external interconnects 306, the integrated circuit packaging system 300 can form a land grid array (LGA) package (not shown).

The terminals 308 can contact the insulation layer 302 and have the contact pads 304 on an external terminal surface 316 of the terminals 308. The terminals 308, aligned horizontally with one another, can include an internal terminal surface 318 opposite the external terminal surface 316. The non-horizontal sides of the terminals 308 can have a curved or concave shape, characteristic of an etching process, and can be in direct contact with the insulation layer 302. The insulation layer 302 can electrically insulate the terminals 308 from each other.

The conductive traces 310 are defined as an electrically conductive structure for redistribution of signals. The conductive traces 310 can extend horizontally from the terminals 308 into a die mounting region 320 defined as an internal region of the integrated circuit packaging system 300 having circuitry, separated from, and aligned laterally with the terminals 308. For example, the conductive traces 310 can be a single layer of conductive plating.

The conductive traces 310 have terminal ends 322 directly on the internal terminal surface 318 of the terminals 308 and circuit ends 324 on the opposite end of the conductive traces 310. The conductive traces 310 can be formed from a conductive material such as gold, silver, nickel, palladium, tin, an alloy thereof, or a combination thereof resistant to etching can be formed from a conductive material such as gold, silver, nickel, palladium, tin, an alloy thereof, or a combination thereof resistant to etching. The conductive traces 310 can be narrower between the terminal ends 322 and the circuit ends 324 for ease of routing, or can be the same size throughout.

Each of the circuit ends 324 can extend into the die mounting region 320 and can be directly on, attached, or connected to the integrated circuit die 312 in the die mounting region 320. The insulation layer 302 can directly cover a portion of the circuit ends 324 facing the integrated circuit die 312. For example, there can be rows of the circuit ends 324 arranged just inside the perimeter of the die mounting region 320.

The integrated circuit die 312 having interconnects, such as a flip chip, can be conformably covered by the insulation layer 302. The integrated circuit die 312 is laterally offset from the terminals 308 and located between the circuit ends 324 and a plane having the external terminal surface 316. A portion of the integrated circuit die 312 is directly under the circuit ends 324. The integrated circuit die 312 can be centrally located or offset within the die mounting region 320.

A heat spreader 330 can be attached to a lower surface of the conductive traces 310 and in contact with non-active side of the integrated circuit die 312. The heat spreader 330 can have legs which contact the conductive traces 310 and a flat surface that can be partially exposed from the insulation layer 302. The legs and an inner surface of the heat spreader 330 can be in contact with and fully covered by the insulation layer 302. The heat spreader 330 can function to dissipate heat, as a path to ground, or a combination thereof.

The package body 314 can be in direct contact with a portion of the insulation layer 302 and the conductive traces 310. The package body 314 is defined as a cover that provides a hermetic seal protecting components from the outside environment. For example, the package body 314 can be a film assisted molding, epoxy molding, moldable underfill, encapsulation, or other protective molding. An internal surface of the package body 314 can have concave surfaces between the terminals 308 characteristic of an etching process.

Peripheral sides of the insulation layer 302 can be coplanar with the peripheral non-horizontal sides of the package body 314. An external insulation surface 328 of the insulation layer 302 can be coplanar with the contact pads 304.

It has been discovered that the integrated circuit die 312 attached to and directly under the circuit ends 324, mounted between the circuit ends 324 and a plane having the external terminal surface 316, substantially reduces an overall height of the integrated circuit packaging system 300.

It has also been discovered that the integrated circuit die 312 being a flip chip rather than a wire-bond chip attached to and directly under the circuit ends 324 increases circuitry performance and manufacturing yield of the integrated circuit packaging system 300. For example, shorter distances for signals to travel can increase circuitry performance and avoiding the use of fragile bond wires can increase manufacturing yield by simplifying manufacturing processes.

It has been unexpectedly discovered that the integrated circuit die 312 having signals routed by the conductive traces 310 to an array of the terminals 308 increases the density of connections in the integrated circuit packaging system 300 without increasing the height and provides for selective routing of signals to any of the terminals 308.

Figure 4:
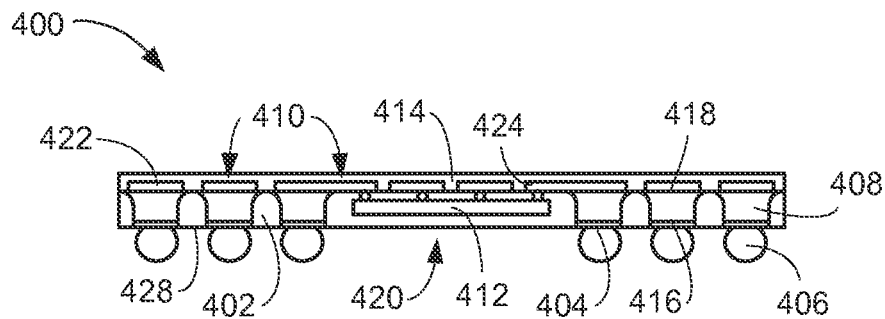
FIG. 4 is a cross-sectional view of the integrated circuit packaging system as exemplified by the isometric bottom view of FIG. 1 and along the section line 2-2 of FIG. 1 in a third embodiment of the present invention.

Referring now to FIG. 4, is a cross-sectional view of the integrated circuit packaging system 400 as exemplified by the isometric bottom view of FIG. 1 and along the section line 2-2 of FIG. 1 in a third embodiment of the present invention. The integrated circuit packaging system 400 is shown having terminals 408, conductive traces 410, an integrated circuit die 412, a package body 414, and an insulation layer 402, as an example.

The insulation layer 402 is defined as an electrically non-conductive layer. For example, the insulation layer 402 can be made from materials such as a solder mask, a liquid crystal polymer (LCP), a molding compound, a polyimide, an epoxy, BT resin, or other resins.

An array of the contact pads 404 can be exposed from the insulation layer 402. The contact pads 404 can be formed from a conductive material such as gold, silver, nickel, palladium, tin, an alloy thereof, or a combination thereof resistant to etching can be formed from a conductive material such as gold, silver, nickel, palladium, tin, an alloy thereof, or a combination thereof resistant to etching.

An array of the external interconnects 406 can be attached to the contact pads 404. For example, the external interconnects 406 can be solder balls, solder bumps, stud bumps, conductive pillars, or a combination thereof. The external interconnects 406 can allow the integrated circuit packaging system 400 to connect to another device, circuit board, or system. The external interconnects 406 on the contact pads 404 are optional. Without the external interconnects 406, the integrated circuit packaging system 400 can form a land grid array (LGA) package (not shown).

The terminals 408 can contact the insulation layer 402 and have the contact pads 404 on an external terminal surface 416 of the terminals 408. The terminals 408, aligned horizontally with one another, can include an internal terminal surface 418 opposite the external terminal surface 416. The non-horizontal sides of the terminals 408 can have a curved or concave shape, characteristic of an etching process, and can be in direct contact with the insulation layer 402. The insulation layer 402 can electrically insulate the terminals 408 from each other.

The conductive traces 410 are defined as an electrically conductive structure for redistribution of signals. The conductive traces 410 can extend horizontally from the terminals 408 into a die mounting region 420 defined as an internal region of the integrated circuit packaging system 400 having circuitry, separated from, and aligned laterally with the terminals 408. For example, the conductive traces 410 can be a single layer of conductive plating.

The conductive traces 410 have terminal ends 422 directly on the internal terminal surface 418 of the terminals 408 and circuit ends 424 on the opposite end of the conductive traces 410. The conductive traces 410 can be formed from a conductive material such as gold, silver, nickel, palladium, tin, an alloy thereof, or a combination thereof resistant to etching. The conductive traces 410 can be narrower between the terminal ends 422 and the circuit ends 424 for ease of routing, or can be the same size throughout.

Each of the circuit ends 424 can extend into the die mounting region 420 and can be directly on, attached, or connected to the integrated circuit die 412 in the die mounting region 420. The insulation layer 402 can directly cover a portion of the circuit ends 424 facing the integrated circuit die 412. For example, there can be a regular or staggered array of the circuit ends 424 arranged inside the die mounting region 420.

The integrated circuit die 412 having interconnects, such as a flip chip, can be conformably covered by the insulation layer 402. The integrated circuit die 412 is laterally offset from the terminals 408 and located between the circuit ends 424 and a plane having the external terminal surface 416. A portion of the integrated circuit die 412 is directly under the circuit ends 424. The integrated circuit die 412 can be centrally located or offset within the die mounting region 420.

The package body 414 can be in direct contact with a portion of the insulation layer 402 and the conductive traces 410. The package body 414 is defined as a cover that provides a hermetic seal protecting components from the outside environment. For example, the package body 414 can be a film assisted molding, epoxy molding, moldable underfill, encapsulation, or other protective molding. An internal surface of the package body 414 can have concave surfaces between the terminals 408 characteristic of an etching process.

Peripheral sides of the insulation layer 402 can be coplanar with the peripheral non-horizontal sides of the package body 414. An external insulation surface 428 of the insulation layer 402 can be coplanar with the contact pads 404.

It has been discovered that the integrated circuit die 412 attached to and directly under the circuit ends 424, mounted between the circuit ends 424 and a plane having the external terminal surface 416, substantially reduces an overall height of the integrated circuit packaging system 400.

It has also been discovered that the integrated circuit die 412 being a flip chip rather than a wire-bond chip attached to and directly under the circuit ends 424 increases circuitry performance and manufacturing yield of the integrated circuit packaging system 400. For example, shorter distances for signals to travel can increase circuitry performance and avoiding the use of fragile bond wires can increase manufacturing yield by simplifying manufacturing processes.

It has been unexpectedly discovered that the integrated circuit die 412 having signals routed by the conductive traces 410 to an array of the terminals 408 increases the density of connections in the integrated circuit packaging system 400 without increasing the height and provides for selective routing of signals to any of the terminals 408.

It has been discovered that a full array of the circuit ends 424 of the conductive traces 410 connected to the integrated circuit die 412 rather than only around the edges of the integrated circuit die 412 increases connectivity options and allows for greater functionality in the integrated circuit packaging system 400.

Figure 5:
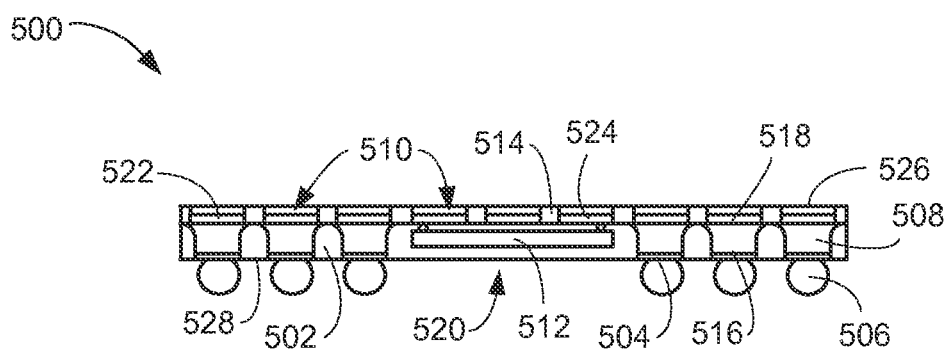
FIG. 5 is a cross-sectional view of the integrated circuit packaging system as exemplified by the isometric bottom view of FIG. 1 and along the section line 2-2 of FIG. 1 in a fourth embodiment of the present invention.

Referring now to FIG. 5, is a cross-sectional view of the integrated circuit packaging system 500 as exemplified by the isometric bottom view of FIG. 1 and along the section line 2-2 of FIG. 1 in a fourth embodiment of the present invention. The integrated circuit packaging system 500 is shown having terminals 508, conductive traces 510, an integrated circuit die 512, a package body 514, and an insulation layer 502, as an example.

The insulation layer 502 is defined as an electrically non-conductive layer. For example, the insulation layer 502 can be made from materials such as a solder mask, a liquid crystal polymer (LCP), a molding compound, a polyimide, an epoxy, BT resin, or other resins.

An array of the contact pads 504 can be exposed from the insulation layer 502. The contact pads 504 can be formed from a conductive material such as gold, silver, nickel, palladium, tin, an alloy thereof, or a combination thereof resistant to etching.

An array of the external interconnects 506 can be attached to the contact pads 504. For example, the external interconnects 506 can be solder balls, solder bumps, stud bumps, conductive pillars, or a combination thereof. The external interconnects 506 can allow the integrated circuit packaging system 500 to connect to another device, circuit board, or system. The external interconnects 506 on the contact pads 504 are optional. Without the external interconnects 506, the integrated circuit packaging system 500 can form a land grid array (LGA) package (not shown).

The terminals 508 can contact the insulation layer 502 and have the contact pads 504 on an external terminal surface 516 of the terminals 508. The terminals 508, aligned horizontally with one another, can include an internal terminal surface 518 opposite the external terminal surface 516. The non-horizontal sides of the terminals 508 can have a curved or concave shape, characteristic of an etching process, and can be in direct contact with the insulation layer 502. The insulation layer 502 can electrically insulate the terminals 508 from each other.

The conductive traces 510 are defined as an electrically conductive structure for redistribution of signals. The conductive traces 510 can extend horizontally from the terminals 508 into a die mounting region 520 defined as an internal region of the integrated circuit packaging system 500 having circuitry, separated from, and aligned laterally with the terminals 508. For example, the conductive traces 510 can be a single layer of conductive plating.

The conductive traces 510 have terminal ends 522 directly on the internal terminal surface 518 of the terminals 508 and circuit ends 524 on the opposite end of the conductive traces 510. The conductive traces 510 can be formed from a conductive material such as gold, silver, nickel, palladium, tin, an alloy thereof, or a combination thereof resistant to etching. The conductive traces 510 can be narrower between the terminal ends 522 and the circuit ends 524 for ease of routing, or can be the same size throughout.

Each of the circuit ends 524 can extend into the die mounting region 520 and can be directly on, attached, or connected to the integrated circuit die 512 in the die mounting region 520. The insulation layer 502 can directly cover a portion of the circuit ends 524 facing the integrated circuit die 512. For example, there can be a regular or staggered array of the circuit ends 524 arranged inside the die mounting region 520. The circuit ends 524 can be left unconnected for other uses such as selective routing or modification of functions of the integrated circuit packaging system 500.

The integrated circuit die 512 having interconnects, such as a flip chip, can be conformably covered by the insulation layer 502. The integrated circuit die 512 is laterally offset from the terminals 508 and located between the circuit ends 524 and a plane having the external terminal surface 516. A portion of the integrated circuit die 512 is directly under the circuit ends 524. The integrated circuit die 512 can be centrally located or offset within the die mounting region 520.

Stacking pads 526 formed of a conductive material are directly on the terminal ends 522 and the circuit ends 524. The stacking pads 526 can be exposed from the package body 514 on a side of the terminal ends 522 facing away from the integrated circuit die 512. The stacking pads 526 can be used to connect the integrated circuit packaging system 500 to any other device, including one that also has the stacking pads 526 for further stacking. The stacking pads 526 on the circuit ends 524 can also be used to modify the functions of the integrated circuit die 512 by using jumpers, resistors, or inductors, for example.

The package body 514 can be in direct contact with a portion of the insulation layer 502, the conductive traces 510, and the stacking pads 526. The package body 514 is defined as a cover that provides a hermetic seal protecting components from the outside environment. For example, the package body 514 can be a film assisted molding, epoxy molding, moldable underfill, encapsulation, or other protective molding. An internal surface of the package body 514 can have concave surfaces between the terminals 508 characteristic of an etching process.

Peripheral sides of the insulation layer 502 can be coplanar with the peripheral non-horizontal sides of the package body 514. An external insulation surface 528 of the insulation layer 502 can be coplanar with the contact pads 504.

It has been discovered that the integrated circuit die 512 attached to and directly under the circuit ends 524, mounted between the circuit ends 524 and a plane having the external terminal surface 516, substantially reduces an overall height of the integrated circuit packaging system 500.

It has also been discovered that the integrated circuit die 512 being a flip chip rather than a wire-bond chip attached to and directly under the circuit ends 524 increases circuitry performance and manufacturing yield of the integrated circuit packaging system 500. For example, shorter distances for signals to travel can increase circuitry performance and avoiding the use of fragile bond wires can increase manufacturing yield by simplifying manufacturing processes.

It has been unexpectedly discovered that the integrated circuit die 512 having signals routed by the conductive traces 510 to an array of the terminals 508 increases the density of connections in the integrated circuit packaging system 500 without increasing the height and provides for selective routing of signals to any of the terminals 508.

It has been discovered that a full array of the circuit ends 524 of the conductive traces 510 connected to the integrated circuit die 512 rather than only around the edges of the integrated circuit die 512 increases connectivity options and allows for greater functionality in the integrated circuit packaging system 500.

It has been unexpectedly found that the stacking pads 526 on the circuit ends 524 connected to the integrated circuit die 512 allows for post-manufacture modification of functions of the integrated circuit die 512. For example, functions of the integrated circuit die 512 can be turned on or off or can be modified by using jumpers, resistors, or other integrated circuit devices connected to specific connections of the integrated circuit die 512 through the stacking pads 526 and the circuit ends 524.

Figure 6:
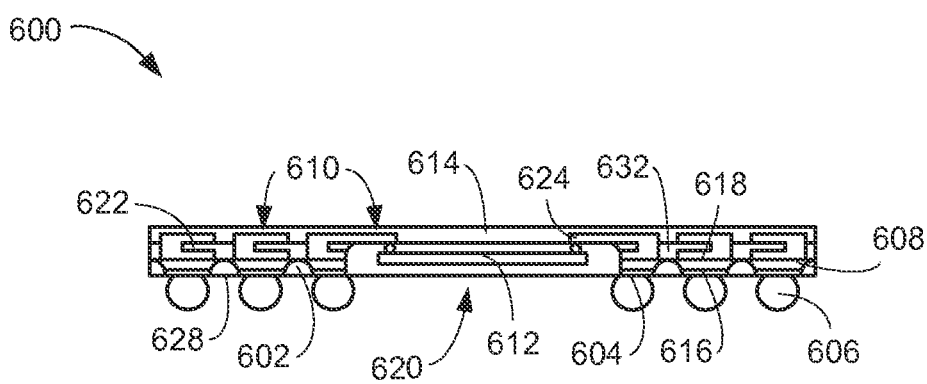
FIG. 6 is a cross-sectional view of the integrated circuit packaging system as exemplified by the isometric bottom view of FIG. 1 and along the section line 2-2 of FIG. 1 in a fifth embodiment of the present invention.

Referring now to FIG. 6, therein is shown a cross-sectional view of the integrated circuit packaging system 600 as exemplified by the isometric bottom view of FIG. 1 and along the section line 2-2 of FIG. 1 in a fifth embodiment of the present invention. The integrated circuit packaging system 600 is shown having terminals 608, conductive traces 610, an integrated circuit die 612, a package body 614, and an insulation layer 602, as an example.

The insulation layer 602 is defined as an electrically non-conductive layer. For example, the insulation layer 602 can be made from materials such as a solder mask, a liquid crystal polymer (LCP), a molding compound, a polyimide, an epoxy, BT resin, or other resins.

An array of the contact pads 604 can be exposed from the insulation layer 602. The contact pads 604 can be formed from a conductive material such as gold, silver, nickel, palladium, tin, an alloy thereof, or a combination thereof resistant to etching.

An array of the external interconnects 606 can be attached to the contact pads 604. For example, the external interconnects 606 can be solder balls, solder bumps, stud bumps, conductive pillars, or a combination thereof. The external interconnects 606 can allow the integrated circuit packaging system 600 to connect to another device, circuit board, or system. The external interconnects 606 on the contact pads 604 are optional. Without the external interconnects 606, the integrated circuit packaging system 600 can form a land grid array (LGA) package (not shown).

The terminals 608 can contact the insulation layer 602 and have the contact pads 604 on an external terminal surface 616 of the terminals 608. The terminals 608, aligned horizontally with one another, can include an internal terminal surface 618 opposite the external terminal surface 616. The non-horizontal sides of the terminals 608 can have a curved or concave shape, characteristic of an etching process, and can be in direct contact with the insulation layer 602. The insulation layer 602 can electrically insulate the terminals 608 from each other.

The conductive traces 610 are defined as an electrically conductive structure for redistribution of signals. The conductive traces 610 can extend horizontally from the terminals 608 into a die mounting region 620 defined as an internal region of the integrated circuit packaging system 600 having circuitry, separated from, and aligned laterally with the terminals 608.

The conductive traces 610 have terminal ends 622 directly on the internal terminal surface 618 of the terminals 608 and circuit ends 624 on the opposite end of the conductive traces 610. The conductive traces 610 can be formed from a conductive material such as gold, silver, nickel, palladium, tin, an alloy thereof, or a combination thereof resistant to etching.

Each of the circuit ends 624 can extend into the die mounting region 620 and can be directly on, attached, or connected to the integrated circuit die 612 in the die mounting region 620. The insulation layer 602 can directly cover a portion of the circuit ends 624 facing the integrated circuit die 612. For example, there can be rows of the circuit ends 624 arranged just inside the perimeter of the die mounting region 620.

The conductive traces 610 can be formed as a two layer structure with a dielectric layer 632 insulating or separating each layer of the two layer structure from the other. The two layers of the conductive traces 610 can be connected through vias which can further route electrical signals in conjunction with the layers of the conductive traces 610. The dielectric layer 632 can have concave surfaces in contact with the insulation layer 602 between the terminals 608 characteristic of an etching process.

The vias of the conductive traces 610 are shown connected directly to the terminal ends 622 though it is understood that the vias can route signals through the layers of the conductive traces 610 at any location and to any of the circuit ends 624. The conductive traces 610 are shown having the two layer structure, though it is understood that the conductive traces 610 can be formed having a multi-layer structure of more than two layers. The circuit ends 624 can be part of any layer. In this example, the circuit ends 624 are on an upper layer spaced away from the terminals 608.

The integrated circuit die 612 having interconnects, such as a flip chip, can be conformably covered by the insulation layer 602. The integrated circuit die 612 is laterally offset from the terminals 608 and located between the circuit ends 624 and a plane having the external terminal surface 616. A portion of the integrated circuit die 612 is directly under the circuit ends 624. The integrated circuit die 612 can be centrally located or offset within the die mounting region 620.

The package body 614 can be in direct contact with a portion of the insulation layer 602, the conductive traces 610, and the dielectric layer 632. The package body 614 is defined as a cover that provides a hermetic seal protecting components from the outside environment. For example, the package body 614 can be a film assisted molding, epoxy molding, moldable underfill, encapsulation, or other protective molding.

Peripheral sides of the insulation layer 602 can be coplanar with the peripheral non-horizontal sides of the package body 614. An external insulation surface 628 of the insulation layer 602 can be coplanar with the contact pads 604.

It has been discovered that the integrated circuit die 612 attached to and directly under the circuit ends 624, mounted between the circuit ends 624 and a plane having the external terminal surface 616, substantially reduces an overall height of the integrated circuit packaging system 600.

It has also been discovered that the integrated circuit die 612 being a flip chip rather than a wire-bond chip attached to and directly under the circuit ends 624 increases circuitry performance and manufacturing yield of the integrated circuit packaging system 600. For example, shorter distances for signals to travel can increase circuitry performance and avoiding the use of fragile bond wires can increase manufacturing yield by simplifying manufacturing processes.

It has been unexpectedly discovered that the integrated circuit die 612 having signals routed by the conductive traces 610 to an array of the terminals 608 increases the density of connections in the integrated circuit packaging system 600 without increasing the height and provides for selective routing of signals to any of the terminals 608.

It has been unexpectedly found that the conductive traces 610 having multiple layers insulated from the other layers but connected through vias increases connector density and the routing capability of the signals from the integrated circuit die 612 to and from the terminals 608 without greatly increasing the size of the integrated circuit packaging system 600. For example, because routing is not limited to a single plane, signals to and from the integrated circuit die 612 and the terminals 608 can easily be routed from any of the terminals 608 to any connection of the integrated circuit die 612.

Figure 7:
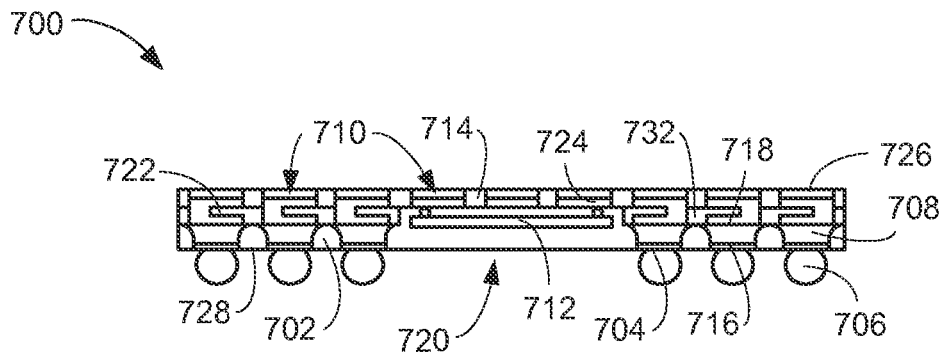
FIG. 7 is a cross-sectional view of the integrated circuit packaging system as exemplified by the isometric bottom view of FIG. 1 and along the section line 2-2 of FIG. 1 in a sixth embodiment of the present invention.

Referring now to FIG. 7, is a cross-sectional view of the integrated circuit packaging system 700 as exemplified by the isometric bottom view of FIG. 1 and along the section line 2-2 of FIG. 1 in a sixth embodiment of the present invention. The integrated circuit packaging system 700 is shown having terminals 708, conductive traces 710, an integrated circuit die 712, a package body 714, and an insulation layer 702, as an example.

The insulation layer 702 is defined as an electrically non-conductive layer. For example, the insulation layer 702 can be made from materials such as a solder mask, a liquid crystal polymer (LCP), a molding compound, a polyimide, an epoxy, BT resin, or other resins.

An array of the contact pads 704 can be exposed from the insulation layer 702. The contact pads 704 can be formed from a conductive material such as gold, silver, nickel, palladium, tin, an alloy thereof, or a combination thereof resistant to etching.

An array of the external interconnects 706 can be attached to the contact pads 704. For example, the external interconnects 706 can be solder balls, solder bumps, stud bumps, conductive pillars, or a combination thereof. The external interconnects 706 can allow the integrated circuit packaging system 700 to connect to another device, circuit board, or system. The external interconnects 706 on the contact pads 704 are optional. Without the external interconnects 706, the integrated circuit packaging system 700 can form a land grid array (LGA) package (not shown).

The terminals 708 can contact the insulation layer 702 and have the contact pads 704 on an external terminal surface 716 of the terminals 708. The terminals 708, aligned horizontally with one another, can include an internal terminal surface 718 opposite the external terminal surface 716. The non-horizontal sides of the terminals 708 can have a curved or concave shape, characteristic of an etching process, and can be in direct contact with the insulation layer 702. The insulation layer 702 can electrically insulate the terminals 708 from each other.

The conductive traces 710 are defined as an electrically conductive structure for redistribution of signals. The conductive traces 710 can extend horizontally from the terminals 708 into a die mounting region 720 defined as an internal region of the integrated circuit packaging system 700 having circuitry, separated from, and aligned laterally with the terminals 708.

The conductive traces 710 have terminal ends 722 directly on the internal terminal surface 718 of the terminals 708 and circuit ends 724 on the opposite end of the conductive traces 710. The conductive traces 710 can be formed from a conductive material such as gold, silver, nickel, palladium, tin, an alloy thereof, or a combination thereof resistant to etching.

Each of the circuit ends 724 can extend into the die mounting region 720 and can be directly on, attached, or connected to the integrated circuit die 712 in the die mounting region 720. The insulation layer 702 can directly cover a portion of the circuit ends 724 facing the integrated circuit die 712. For example, there can be rows of the circuit ends 724 arranged just inside the perimeter of the die mounting region 720.

The conductive traces 710 can be formed as a two layer structure with a dielectric layer 732 insulating or separating each layer of the two layer structure from the other. The two layers of the conductive traces 710 can be connected through vias which can further route electrical signals in conjunction with the layers of the conductive traces 710. The dielectric layer 732 can have concave surfaces in contact with the insulation layer 702 between the terminals 708 characteristic of an etching process.

The vias of the conductive traces 710 are shown connected directly to the terminal ends 722 though it is understood that the vias can route signals through the layers of the conductive traces 710 at any location and to any of the circuit ends 724. The conductive traces 710 are shown having the two layer structure, though it is understood that the conductive traces 710 can be formed having a multi-layer structure of more than two layers. The circuit ends 724 can be part of any layer. In this example, the circuit ends are on an upper layer spaced away from the terminals 708.

The integrated circuit die 712 having interconnects, such as a flip chip, can be conformably covered by the insulation layer 702. The integrated circuit die 712 is laterally offset from the terminals 708 and located between the circuit ends 724 and a plane having the external terminal surface 716. A portion of the integrated circuit die 712 is directly under the circuit ends 724. The integrated circuit die 712 can be centrally located or offset within the die mounting region 720.

Stacking pads 726 formed of a conductive material are on the circuit ends 724 and the conductive traces 710 above the terminal ends 722. The stacking pads 726 can be exposed from the package body 714 on a side of the terminal ends 722 facing away from the integrated circuit die 712. The stacking pads 726 can be used to connect the integrated circuit packaging system 700 to any other device, including one that also has the stacking pads 726 for further stacking. The stacking pads 726 on the circuit ends 724 can also be used to modify the functions of the integrated circuit die 712 by using jumpers, resistors, or inductors, for example.

The package body 714 can be in direct contact with a portion of the insulation layer 702, the conductive traces 710, the stacking pads 726, and the dielectric layer 732. The package body 714 is defined as a cover that provides a hermetic seal protecting components from the outside environment. For example, the package body 714 can be a film assisted molding, epoxy molding, moldable underfill, encapsulation, or other protective molding.

Peripheral sides of the insulation layer 702 can be coplanar with the peripheral non-horizontal sides of the package body 714. An external insulation surface 728 of the insulation layer 702 can be coplanar with the contact pads 704.

It has been discovered that the integrated circuit die 712 attached to and directly under the circuit ends 724, mounted between the circuit ends 724 and a plane having the external terminal surface 716, substantially reduces an overall height of the integrated circuit packaging system 700.

It has also been discovered that the integrated circuit die 712 being a flip chip rather than a wire-bond chip attached to and directly under the circuit ends 724 increases circuitry performance and manufacturing yield of the integrated circuit packaging system 700. For example, shorter distances for signals to travel can increase circuitry performance and avoiding the use of fragile bond wires can increase manufacturing yield by simplifying manufacturing processes.

It has been unexpectedly discovered that the integrated circuit die 712 having signals routed by the conductive traces 710 to an array of the terminals 708 increases the density of connections in the integrated circuit packaging system 700 without increasing the height and provides for selective routing of signals to any of the terminals 708.

It has been unexpectedly found that the conductive traces 710 having multiple layers insulated from the other layers but connected through vias increases connector density and the routing capability of the signals from the integrated circuit die 712 to and from the terminals 708 without greatly increasing the size of the integrated circuit packaging system 700. For example, because routing is not limited to a single plane, signals to and from the integrated circuit die 712 and the terminals 708 can easily be routed from any of the terminals 708 to any connection of the integrated circuit die 712.

It has been discovered that a full array of the circuit ends 724 of the conductive traces 710 connected to the integrated circuit die 712 rather than only around the edges of the integrated circuit die 712 increases connectivity options and allows for greater functionality in the integrated circuit packaging system 700.

It has been unexpectedly found that the stacking pads 726 on the circuit ends 724 connected to the integrated circuit die 712 allows for post-manufacture modification of functions of the integrated circuit die 712. For example, functions of the integrated circuit die 712 can be turned on or off or can be modified by using jumpers, resistors, or other integrated circuit devices connected to specific connections of the integrated circuit die 712 through the stacking pads 726 and the circuit ends 724.

Figure 8:
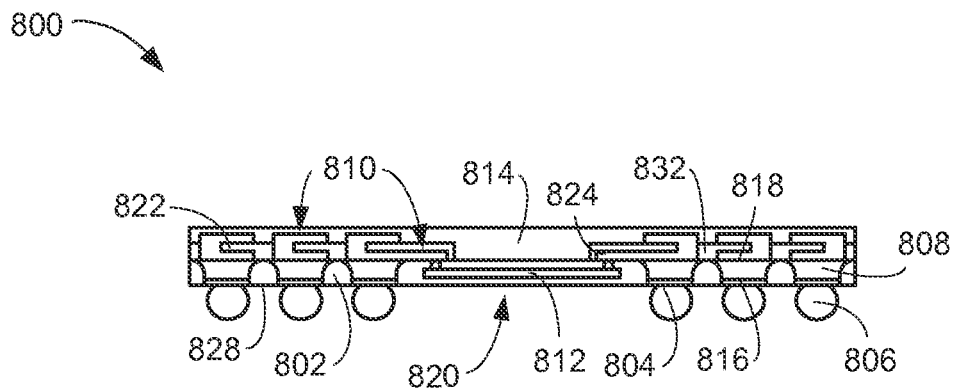
FIG. 8 is a cross-sectional view of the integrated circuit packaging system as exemplified by the isometric bottom view of FIG. 1 and along the section line 2-2 of FIG. 1 in a seventh embodiment of the present invention.

Referring now to FIG. 8, is a cross-sectional view of the integrated circuit packaging system 800 as exemplified by the isometric bottom view of FIG. 1 and along the section line 2-2 of FIG. 1 in a seventh embodiment of the present invention. The integrated circuit packaging system 800 is shown having terminals 808, conductive traces 810, an integrated circuit die 812, a package body 814, and an insulation layer 802, as an example.

The insulation layer 802 is defined as an electrically non-conductive layer. For example, the insulation layer 802 can be made from materials such as a solder mask, a liquid crystal polymer (LCP), a molding compound, a polyimide, an epoxy, BT resin, or other resins.

An array of the contact pads 804 can be exposed from the insulation layer 802. The contact pads 804 can be formed from a conductive material such as gold, silver, nickel, palladium, tin, an alloy thereof, or a combination thereof resistant to etching.

An array of the external interconnects 806 can be attached to the contact pads 804. For example, the external interconnects 806 can be solder balls, solder bumps, stud bumps, conductive pillars, or a combination thereof. The external interconnects 806 can allow the integrated circuit packaging system 800 to connect to another device, circuit board, or system. The external interconnects 806 on the contact pads 804 are optional. Without the external interconnects 806, the integrated circuit packaging system 800 can form a land grid array (LGA) package (not shown).

The terminals 808 can contact the insulation layer 802 and have the contact pads 804 on an external terminal surface 816 of the terminals 808. The terminals 808, aligned horizontally with one another, can include an internal terminal surface 818 opposite the external terminal surface 816. The non-horizontal sides of the terminals 808 can have a curved or concave shape, characteristic of an etching process, and can be in direct contact with the insulation layer 802. The insulation layer 802 can electrically insulate the terminals 808 from each other.

The conductive traces 810 are defined as an electrically conductive structure for redistribution of signals. The conductive traces 810 can extend horizontally from the terminals 808 into a die mounting region 820 defined as an internal region of the integrated circuit packaging system 800 having circuitry, separated from, and aligned laterally with the terminals 808.

The conductive traces 810 have terminal ends 822 directly on the internal terminal surface 818 of the terminals 808 and circuit ends 824 on the opposite end of the conductive traces 810. The conductive traces 810 can be formed from a conductive material such as gold, silver, nickel, palladium, tin, an alloy thereof, or a combination thereof resistant to etching.

Each of the circuit ends 824 can extend into the die mounting region 820 and can be directly on, attached, or connected to the integrated circuit die 812 in the die mounting region 820. The insulation layer 802 can directly cover a portion of the circuit ends 824 facing the integrated circuit die 812. For example, there can be rows of the circuit ends 824 arranged just inside the perimeter of the die mounting region 820.

The conductive traces 810 can be formed as a two layer structure with a dielectric layer 832 insulating or separating each layer of the two layer structure from the other. The two layers of the conductive traces 810 can be connected through vias which can further route electrical signals in conjunction with the layers of the conductive traces 810. The dielectric layer 832 can have concave surfaces in contact with the insulation layer 802 between the terminals 808 characteristic of an etching process.

The vias of the conductive traces 810 are shown connected directly to the terminal ends 822 though it is understood that the vias can route signals through the layers of the conductive traces 810 at any location and to any of the circuit ends 824. The conductive traces 810 are shown having the two layer structure, though it is understood that the conductive traces 810 can be formed having a multi-layer structure of more than two layers. The circuit ends 824 can be part of any layer. In this example, the circuit ends 824 are on a lower layer on the same plane as the terminal ends 822.

The integrated circuit die 812 having interconnects, such as a flip chip, can be conformably covered by the insulation layer 802. The integrated circuit die 812 is laterally offset from the terminals 808 and located between the circuit ends 824 and a plane having the external terminal surface 816. A portion of the integrated circuit die 812 is directly under the circuit ends 824. The integrated circuit die 812 can be centrally located or offset within the die mounting region 820.

The package body 814 can be in direct contact with a portion of the insulation layer 802, the conductive traces 810, and the dielectric layer 832. The package body 814 is defined as a cover that provides a hermetic seal protecting components from the outside environment. For example, the package body 814 can be a film assisted molding, epoxy molding, moldable underfill, encapsulation, or other protective molding.

Peripheral sides of the insulation layer 802 can be coplanar with the peripheral non-horizontal sides of the package body 814. An external insulation surface 828 of the insulation layer 802 can be coplanar with the contact pads 804.

It has been discovered that the integrated circuit die 812 attached to and directly under the circuit ends 824, mounted between the circuit ends 824 and a plane having the external terminal surface 816, substantially reduces an overall height of the integrated circuit packaging system 800.

It has also been discovered that the integrated circuit die 812 being a flip chip rather than a wire-bond chip attached to and directly under the circuit ends 824 increases circuitry performance and manufacturing yield of the integrated circuit packaging system 800. For example, shorter distances for signals to travel can increase circuitry performance and avoiding the use of fragile bond wires can increase manufacturing yield by simplifying manufacturing processes.

It has been unexpectedly discovered that the integrated circuit die 812 having signals routed by the conductive traces 810 to an array of the terminals 808 increases the density of connections in the integrated circuit packaging system 800 without increasing the height and provides for selective routing of signals to any of the terminals 808.

It has been unexpectedly found that the conductive traces 810 having multiple layers insulated from the other layers but connected through vias increases connector density and the routing capability of the signals from the integrated circuit die 812 to and from the terminals 808 without greatly increasing the size of the integrated circuit packaging system 800. For example, because routing is not limited to a single plane, signals to and from the integrated circuit die 812 and the terminals 808 can easily be routed from any of the terminals 808 to any connection of the integrated circuit die 812.

Figure 9:
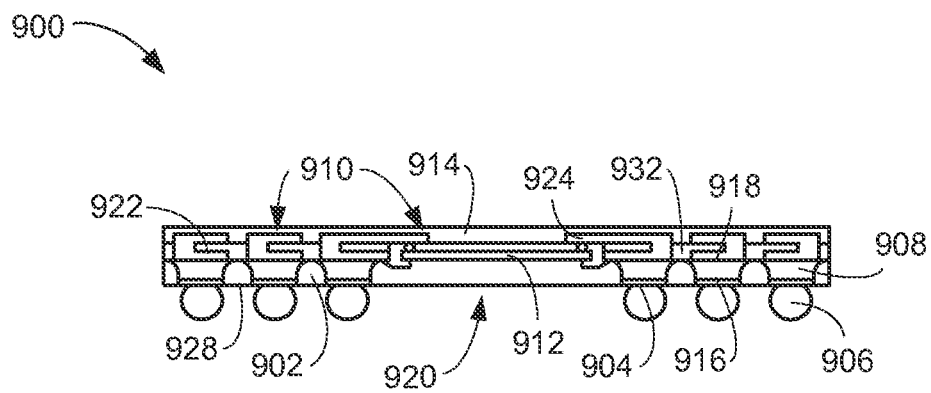
FIG. 9 is a cross-sectional view of the integrated circuit packaging system as exemplified by the isometric bottom view of FIG. 1 and along the section line 2-2 of FIG. 1 in an eighth embodiment of the present invention.

Referring now to FIG. 9, therein is shown a cross-sectional view of the integrated circuit packaging system 900 as exemplified by the isometric bottom view of FIG. 1 and along the section line 2-2 of FIG. 1 in an eighth embodiment of the present invention. The integrated circuit packaging system 900 is shown having terminals 908, conductive traces 910, an integrated circuit die 912, a package body 914, and an insulation layer 902, as an example.

The insulation layer 902 is defined as an electrically non-conductive layer. For example, the insulation layer 902 can be made from materials such as a solder mask, a liquid crystal polymer (LCP), a molding compound, a polyimide, an epoxy, BT resin, or other resins.

An array of the contact pads 904 can be exposed from the insulation layer 902. The contact pads 904 can be formed from a conductive material such as gold, silver, nickel, palladium, tin, an alloy thereof, or a combination thereof resistant to etching.

An array of the external interconnects 906 can be attached to the contact pads 904. For example, the external interconnects 906 can be solder balls, solder bumps, stud bumps, conductive pillars, or a combination thereof. The external interconnects 906 can allow the integrated circuit packaging system 900 to connect to another device, circuit board, or system. The external interconnects 906 on the contact pads 904 are optional. Without the external interconnects 906, the integrated circuit packaging system 900 can form a land grid array (LGA) package (not shown).

The terminals 908 can contact the insulation layer 902 and have the contact pads 904 on an external terminal surface 916 of the terminals 908. The terminals 908, aligned horizontally with one another, can include an internal terminal surface 918 opposite the external terminal surface 916. The non-horizontal sides of the terminals 908 can have a curved or concave shape, characteristic of an etching process, and can be in direct contact with the insulation layer 902. The insulation layer 902 can electrically insulate the terminals 908 from each other.

The conductive traces 910 are defined as an electrically conductive structure for redistribution of signals. The conductive traces 910 can extend horizontally from the terminals 908 into a die mounting region 920 defined as an internal region of the integrated circuit packaging system 900 having circuitry, separated from, and aligned laterally with the terminals 908.

The conductive traces 910 have terminal ends 922 directly on the internal terminal surface 918 of the terminals 908 and circuit ends 924 on the opposite end of the conductive traces 910. The conductive traces 910 can be formed from a conductive material such as gold, silver, nickel, palladium, tin, an alloy thereof, or a combination thereof resistant to etching. For example, the terminal ends 922 adjacent to the perimeter of the die mounting region 920 can extend towards the die mounting region 920 off the internal terminal surface 918 of the terminals 908.

Each of the circuit ends 924 can extend into the die mounting region 920 and can be directly on, attached, or connected to the integrated circuit die 912 in the die mounting region 920. The insulation layer 902 can directly cover a portion of the circuit ends 924 facing the integrated circuit die 912. For example, there can be rows of the circuit ends 924 arranged just inside the perimeter of the die mounting region 920.

The conductive traces 910 can be formed as a two layer structure with a dielectric layer 932 insulating or separating each layer of the two layer structure from the other. The two layers of the conductive traces 910 can be connected through vias which can further route electrical signals in conjunction with the layers of the conductive traces 910. The dielectric layer 932 can have concave surfaces in contact with the insulation layer 902 between the terminals 908 characteristic of an etching process.

The vias of the conductive traces 910 are shown connected directly to the terminal ends 922 though it is understood that the vias can route signals through the layers of the conductive traces 910 at any location and to any of the circuit ends 924. The conductive traces 910 are shown having the two layer structure, though it is understood that the conductive traces 910 can be formed having a multilayer structure of more than two layers. The circuit ends 924 can be part of any layer. In this example, the circuit ends 924 are on an upper layer spaced away from the terminals 908.

The integrated circuit die 912 having interconnects, such as a flip chip, can be conformably covered by the insulation layer 902. The integrated circuit die 912 is laterally offset from the terminals 908 and located between the circuit ends 924 and a plane having the external terminal surface 916. A portion of the integrated circuit die 912 is directly under the circuit ends 924. The integrated circuit die 912 can be centrally located or offset within the die mounting region 920.

The integrated circuit die 912 can also be connected to the terminal ends 922 extended into the die mounting region 920. For example, the integrated circuit die 912 can have connections, such as bond wires, on a non-active side by using through silicon vias (TSVs) and electrically connecting the TSVs of the integrated circuit die 912 to the terminal ends 922 extended towards the integrated circuit die 912.

The package body 914 can be in direct contact with a portion of the insulation layer 902, the conductive traces 910, and the dielectric layer 932. The package body 914 is defined as a cover that provides a hermetic seal protecting components from the outside environment. For example, the package body 914 can be a film assisted molding, epoxy molding, moldable underfill, encapsulation, or other protective molding.

Peripheral sides of the insulation layer 902 can be coplanar with the peripheral non-horizontal sides of the package body 914. An external insulation surface 928 of the insulation layer 902 can be coplanar with the contact pads 904.

It has been discovered that the integrated circuit die 912 attached to and directly under the circuit ends 924, mounted between the circuit ends 924 and a plane having the external terminal surface 916, substantially reduces an overall height of the integrated circuit packaging system 900.

It has also been discovered that the integrated circuit die 912 being a flip chip rather than a wire-bond chip attached to and directly under the circuit ends 924 increases circuitry performance and manufacturing yield of the integrated circuit packaging system 900. For example, shorter distances for signals to travel can increase circuitry performance and avoiding the use of fragile bond wires can increase manufacturing yield by simplifying manufacturing processes.

It has been unexpectedly discovered that the integrated circuit die 912 having signals routed by the conductive traces 910 to an array of the terminals 908 increases the density of connections in the integrated circuit packaging system 900 without increasing the height and provides for selective routing of signals to any of the terminals 908.

It has been unexpectedly found that the conductive traces 910 having multiple layers insulated from the other layers but connected through vias increases connector density and the routing capability of the signals from the integrated circuit die 912 to and from the terminals 908 without greatly increasing the size of the integrated circuit packaging system 900. For example, because routing is not limited to a single plane, signals to and from the integrated circuit die 912 and the terminals 908 can easily be routed from any of the terminals 908 to any connection of the integrated circuit die 912.

It has been discovered that the integrated circuit die 912 having input/output (I/O) capability on the active and non-active sides and connected to both the circuit ends 924 and the terminal ends 922 increases I/O density and provides greater connection options for the conductive traces 910 in the integrated circuit packaging system 900. For example, the increase in I/O capability and increased routing possibilities of the conductive traces 910 having multiple layers increases potential functions and connection possibilities for the integrated circuit die 912.

Figure 10:
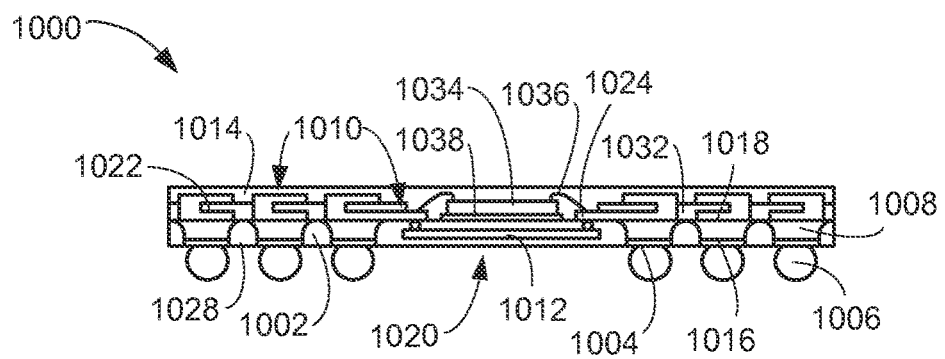
FIG. 10 is a cross-sectional view of the integrated circuit packaging system as exemplified by the isometric bottom view of FIG. 1 and along the section line 2-2 of FIG. 1 in a ninth embodiment of the present invention.

Referring now to FIG. 10, therein is shown a cross-sectional view of the integrated circuit packaging system 1000 as exemplified by the isometric bottom view of FIG. 1 and along the section line 2-2 of FIG. 1 in a ninth embodiment of the present invention. The integrated circuit packaging system 1000 is shown having terminals 1008, conductive traces 1010, an integrated circuit die 1012, a package body 1014, and an insulation layer 1002, as an example.

The insulation layer 1002 is defined as an electrically non-conductive layer. For example, the insulation layer 1002 can be made from materials such as a solder mask, a liquid crystal polymer (LCP), a molding compound, a polyimide, an epoxy, BT resin, or other resins.

An array of the contact pads 1004 can be exposed from the insulation layer 1002. The contact pads 1004 can be formed from a conductive material such as gold, silver, nickel, palladium, tin, an alloy thereof, or a combination thereof resistant to etching.

An array of the external interconnects 1006 can be attached to the contact pads 1004. For example, the external interconnects 1006 can be solder balls, solder bumps, stud bumps, conductive pillars, or a combination thereof. The external interconnects 1006 can allow the integrated circuit packaging system 1000 to connect to another device, circuit board, or system. The external interconnects 1006 on the contact pads 1004 are optional. Without the external interconnects 1006, the integrated circuit packaging system 1000 can form a land grid array (LGA) package (not shown).

The terminals 1008 can contact the insulation layer 1002 and have the contact pads 1004 on an external terminal surface 1016 of the terminals 1008. The terminals 1008, aligned horizontally with one another, can include an internal terminal surface 1018 opposite the external terminal surface 1016. The non-horizontal sides of the terminals 1008 can have a curved or concave shape, characteristic of an etching process, and can be in direct contact with the insulation layer 1002. The insulation layer 1002 can electrically insulate the terminals 1008 from each other.

The conductive traces 1010 are defined as an electrically conductive structure for redistribution of signals. The conductive traces 1010 can extend horizontally from the terminals 1008 into a die mounting region 1020 defined as an internal region of the integrated circuit packaging system 1000 having circuitry, separated from, and aligned laterally with the terminals 1008.

The conductive traces 1010 have terminal ends 1022 directly on the internal terminal surface 1018 of the terminals 1008 and circuit ends 1024 on the opposite end of the conductive traces 1010. The conductive traces 1010 can be formed from a conductive material such as gold, silver, nickel, palladium, tin, an alloy thereof, or a combination thereof resistant to etching.

Each of the circuit ends 1024 can extend into the die mounting region 1020 and can be directly on, attached, or connected to the integrated circuit die 1012 in the die mounting region 1020. The insulation layer 1002 can directly cover a portion of the circuit ends 1024 facing the integrated circuit die 1012. For example, there can be rows of the circuit ends 1024 arranged just inside the perimeter of the die mounting region 1020.

The conductive traces 1010 can be formed as a two layer structure with a dielectric layer 1032 insulating or separating each layer of the two layer structure from the other. The two layers of the conductive traces 1010 can be connected through vias which can further route electrical signals in conjunction with the layers of the conductive traces 1010. The dielectric layer 1032 can have concave surfaces in contact with the insulation layer 1002 between the terminals 1008 characteristic of an etching process.

The vias of the conductive traces 1010 are shown connected directly to the terminal ends 1022 though it is understood that the vias can route signals through the layers of the conductive traces 1010 at any location and to any of the circuit ends 1024. The conductive traces 1010 are shown having the two layer structure, though it is understood that the conductive traces 1010 can be formed having a multi-layer structure of more than two layers. The circuit ends 1024 can be part of any layer. In this example, the circuit ends 1024 are on a lower layer on the same plane as the terminal ends 1022.

The integrated circuit die 1012 having interconnects, such as a flip chip, can be conformably covered by the insulation layer 1002. The integrated circuit die 1012 is laterally offset from the terminals 1008 and located between the circuit ends 1024 and a plane having the external terminal surface 1016. A portion of the integrated circuit die 1012 is directly under the circuit ends 1024. The integrated circuit die 1012 can be centrally located or offset within the die mounting region 1020.

An additional integrated circuit die 1034 such as a flip chip or a wire-bond chip can be connected to an upper surface of the circuit ends 1024 exposed from the dielectric layer 1032 through an additional interconnect 1036 such as a bond wire or solder ball. The additional integrated circuit die 1034 can be located above the integrated circuit die 1012 and can have a die attach adhesive 1038 on and between the additional integrated circuit die 1034 and the insulation layer 1002 coplanar with an internal surface of the package body 1014.

The package body 1014 can be in direct contact with a portion of the insulation layer 1002 and the conductive traces 1010. The package body 1014 is defined as a cover that provides a hermetic seal protecting components from the outside environment. For example, the package body 1014 can be a film assisted molding, epoxy molding, moldable underfill, encapsulation, or other protective molding.

The package body 1014 can contact and surround the additional integrated circuit die 1034. Peripheral sides of the insulation layer 1002 can be coplanar with the peripheral non-horizontal sides of the package body 1014. An external insulation surface 1028 of the insulation layer 1002 can be coplanar with the contact pads 1004.

It has been discovered that the integrated circuit die 1012 attached to and directly under the circuit ends 1024, mounted between the circuit ends 1024 and a plane having the external terminal surface 1016, substantially reduces an overall height of the integrated circuit packaging system 1000.

It has also been discovered that the integrated circuit die 1012 being a flip chip rather than a wire-bond chip attached to and directly under the circuit ends 1024 increases circuitry performance and manufacturing yield of the integrated circuit packaging system 1000. For example, shorter distances for signals to travel can increase circuitry performance and avoiding the use of fragile bond wires can increase manufacturing yield by simplifying manufacturing processes.

It has been unexpectedly discovered that the integrated circuit die 1012 having signals routed by the conductive traces 1010 to an array of the terminals 1008 increases the density of connections in the integrated circuit packaging system 1000 without increasing the height and provides for selective routing of signals to any of the terminals 1008.

It has been unexpectedly found that the conductive traces 1010 having multiple layers insulated from the other layers but connected through vias increases connector density and the routing capability of the signals from the integrated circuit die 1012 to and from the terminals 1008 without greatly increasing the size of the integrated circuit packaging system 1000. For example, because routing is not limited to a single plane, signals to and from the integrated circuit die 1012 and the terminals 1008 can easily be routed from any of the terminals 1008 to any connection of the integrated circuit die 1012.

It has been discovered that the additional integrated circuit die 1034 connected to the circuit ends 1024 opposite the integrated circuit die 1012 increases functionality of the integrated circuit packaging system 1000. For example, the additional integrated circuit die 1034 can add functions, can be a memory chip, or can boost the speed of existing functions of the integrated circuit die 1012.

Figure 11:
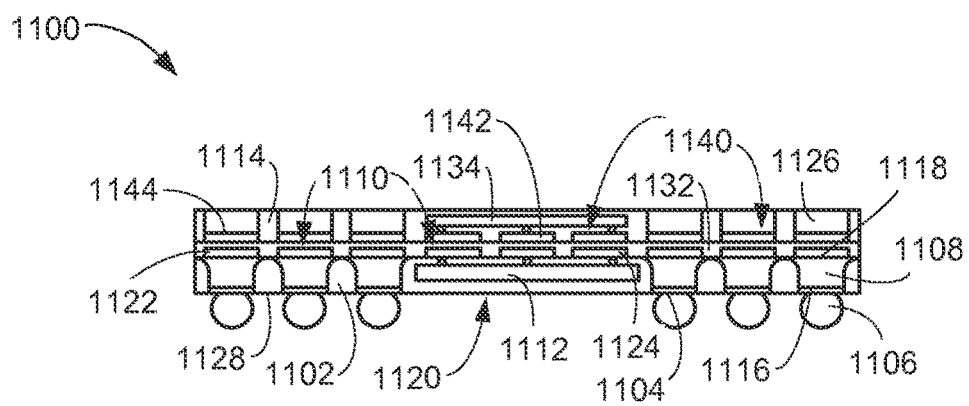
FIG. 11 is a cross-sectional view of the integrated circuit packaging system as exemplified by the isometric bottom view of FIG. 1 and along the section line 2-2 of FIG. 1 in a tenth embodiment of the present invention.

Referring now to FIG. 11, therein is shown a cross-sectional view of the integrated circuit packaging system 1100 as exemplified by the isometric bottom view of FIG. 1 and along the section line 2-2 of FIG. 1 in a tenth embodiment of the present invention. The integrated circuit packaging system 1100 is shown having terminals 1108, first conductive traces 1110, an integrated circuit die 1112, a package body 1114, and an insulation layer 1102, as an example.

The insulation layer 1102 is defined as an electrically non-conductive layer. For example, the insulation layer 1102 can be made from materials such as a solder mask, a liquid crystal polymer (LCP), a molding compound, a polyimide, an epoxy, BT resin, or other resins.

An array of the contact pads 1104 can be exposed from the insulation layer 1102. The contact pads 1104 can be formed from a conductive material such as gold, silver, nickel, palladium, tin, an alloy thereof, or a combination thereof resistant to etching.

An array of the external interconnects 1106 can be attached to the contact pads 1104. For example, the external interconnects 1106 can be solder balls, solder bumps, stud bumps, conductive pillars, or a combination thereof. The external interconnects 1106 can allow the integrated circuit packaging system 1100 to connect to another device, circuit board, or system. The external interconnects 1106 on the contact pads 1104 are optional. Without the external interconnects 1106, the integrated circuit packaging system 1100 can form a land grid array (LGA) package (not shown).

The terminals 1108 can contact the insulation layer 1102 and have the contact pads 1104 on an external terminal surface 1116 of the terminals 1108. The terminals 1108, aligned horizontally with one another, can include an internal terminal surface 1118 opposite the external terminal surface 1116. The non-horizontal sides of the terminals 1108 can have a curved or concave shape, characteristic of an etching process, and can be in direct contact with the insulation layer 1102. The insulation layer 1102 can electrically insulate the terminals 1108 from each other.

The first conductive traces 1110 are defined as an electrically conductive structure for redistribution of signals. The first conductive traces 1110 can extend horizontally from the terminals 1108 into a die mounting region 1120 defined as an internal region of the integrated circuit packaging system 1100 having circuitry, separated from, and aligned laterally with the terminals 1108.

The first conductive traces 1110 have first terminal ends 1122 directly on the internal terminal surface 1118 of the terminals 1108 and first circuit ends 1124 on the opposite end of the first conductive traces 1110. The first conductive traces 1110 can be formed from a conductive material such as gold, silver, nickel, palladium, tin, an alloy thereof, or a combination thereof resistant to etching.

Each of the first circuit ends 1124 can extend into the die mounting region 1120 and can be directly on, attached, or connected to the integrated circuit die 1112 in the die mounting region 1120. The insulation layer 1102 can directly cover a portion of the first circuit ends 1124 facing the integrated circuit die 1112. For example, there can be a full regular or staggered array of the first circuit ends 1124 arranged inside the die mounting region 1120.

The integrated circuit die 1112 having interconnects, such as a flip chip, can be conformably covered by the insulation layer 1102. The integrated circuit die 1112 is laterally offset from the terminals 1108 and located between the first circuit ends 1124 and a plane having the external terminal surface 1116. A portion of the integrated circuit die 1112 is directly under the first circuit ends 1124. The integrated circuit die 1112 can be centrally located or offset within the die mounting region 1120.

The side of the first conductive traces 1110 opposite the integrated circuit die 1112 can be covered in a dielectric layer 1132. Second conductive traces 1140 having second circuit ends 1142 and second terminal ends 1144 can be connected to the first conductive traces 1110 through vias (not shown) in the dielectric layer 1132, or can be electrically isolated from the first conductive traces 1110. The dielectric layer 1132 can have concave surfaces in contact with the insulation layer 1102 between the terminals 1108 characteristic of an etching process.

The vias can route signals through the first conductive traces 1110 and second conductive traces 1140 and connect the first circuit ends 1124, the first terminal ends 1122, the second circuit ends 1142, and the second terminal ends 1144 in any combination. The second conductive traces 1140, the second circuit ends 1142, and the second terminal ends 1144 can have a similar routing structure to the first conductive traces 1110, the first circuit ends 1124, and the first terminal ends 1122, respectively. For example, there can be a full regular or staggered array of the second circuit ends 1142 arranged above the first circuit ends 1124. Also for example, the second terminal ends 1144 can be offset from the first terminal ends 1122.

An additional integrated circuit die 1134 such as a flip chip or a wire-bond chip can be directly connected to the second circuit ends 1142 and located above the integrated circuit die 1112. Stacking pads 1126 formed of a conductive material can be arranged around the additional integrated circuit die 1134 on the second terminal ends 1144. The stacking pads 1126 can be exposed from the package body 1114 and can be used to connect to any other device, including one that also has the stacking pads 1126 for further stacking.

The package body 1114 can be in direct contact with the dielectric layer 1132, the second conductive traces 1140, and the stacking pads 1126. The package body 1114 is defined as a cover that provides a hermetic seal protecting components from the outside environment. For example, the package body 1114 can be a film assisted molding, epoxy molding, moldable underfill, encapsulation, or other protective molding.

The package body 1114 can contact and conform to the additional integrated circuit die 1134 and can contact the second circuit ends 1142. Peripheral sides of the insulation layer 1102 can be coplanar with the peripheral non-horizontal sides of the package body 1114 and peripheral sides of the dielectric layer 1132, characteristic of a singulation process. An external insulation surface 1128 of the insulation layer 1102 can be coplanar with the contact pads 1104.

It has been discovered that the integrated circuit die 1112 attached to and directly under the first circuit ends 1124, mounted between the first circuit ends 1124 and a plane having the external terminal surface 1116, substantially reduces an overall height of the integrated circuit packaging system 1100.

It has also been discovered that the integrated circuit die 1112 being a flip chip rather than a wire-bond chip attached to and directly under the first circuit ends 1124 increases circuitry performance and manufacturing yield of the integrated circuit packaging system 1100. For example, shorter distances for signals to travel can increase circuitry performance and avoiding the use of fragile bond wires can increase manufacturing yield by simplifying manufacturing processes.

It has been unexpectedly discovered that the integrated circuit die 1112 having signals routed by the first conductive traces 1110 to an array of the terminals 1108 increases the density of connections in the integrated circuit packaging system 1100 without increasing the height and provides for selective routing of signals to any of the terminals 1108.

It has been unexpectedly found that the first conductive traces 1110 connected to the second conductive traces 1140 through vias increases connector density and the routing capability of the signals from the integrated circuit die 1112 and the additional integrated circuit die 1134 to and from the terminals 1108 without greatly increasing the size of the integrated circuit packaging system 1100.

It has been discovered that the additional integrated circuit die 1134 and the stacking pads 1126 increase functionality of the integrated circuit packaging system 1100. For example, the additional integrated circuit die 1134 can add functions, can be a memory chip, or can boost the speed of existing functions of the integrated circuit die 1112. Also for example, the stacking pads 1126 on the second conductive traces 1140 can allow signals to be routed to the terminals 1108, the stacking pads 1126, or both.

It has been discovered that a full array of the first circuit ends 1124 and the second circuit ends 1142 connected to the integrated circuit die 1112 or the additional integrated circuit die 1134 rather than only around the edges of the integrated circuit die 1112 increases connectivity options and allows for greater functionality in the integrated circuit packaging system 1100.

Figure 12:
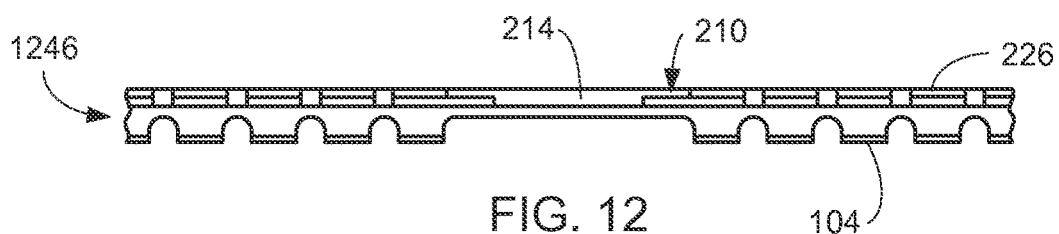
FIG. 12 is a cross-sectional view of the integrated circuit packaging system of FIG. 2 in an encapsulation phase of manufacture.

Referring now to FIG. 12, therein is shown a cross-sectional view of the integrated circuit packaging system 100 of FIG. 2 in an encapsulation phase of manufacture. A leadframe 1246 is shown having a planar side with the conductive traces 210 and a partially etched side with the contact pads 104 opposite the planar side. Portions of the side of the leadframe 1246 with the contact pads 104 can be partially removed between the contact pads 104 through a process such as etching, cutting, grinding, or laser ablation, though it is understood that this is optional.

An array of the contact pads 104 is arranged around the center of the leadframe 1246 where a portion of the leadframe 1246 can also be removed. The contact pads 104 can be used as an etching protection layer, a diffusion barrier layer, a wet-enhancing layer, or a combination thereof. The stacking pads 226 can be applied in an optional step on the conductive traces 210 by a process such as sputtering, electroplating, chemical vapor deposition (CVD), or in conjunction with a mask.

The package body 214 can then be applied on the conductive traces 210 and surround and expose the stacking pads 226, if present, in the encapsulation phase using a process such as a molding, cleaning, heating, or injection process.

Figure 13:
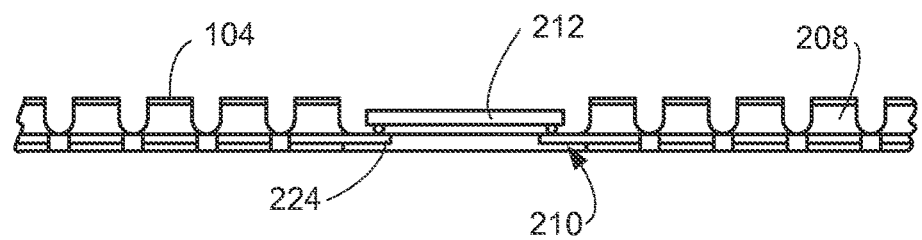
FIG. 13 is the structure of FIG. 12 in a die mounting phase.

Referring now to FIG. 13, therein is shown the structure of FIG. 12 in a die mounting phase. FIG. 13 is shown flipped in orientation as compared to FIG. 12. A portion of the leadframe 1246 of FIG. 12 between the contact pads 104 can be removed by a process such as etching, cutting, or laser ablation to isolate and form the terminals 208.

Following the formation of the terminals 208, the integrated circuit die 212 having interconnects can be connected directly on the circuit ends 224 of the conductive traces 210 in the die mounting phase. The die mounting phase can include a reflow, heating, cleaning, or attaching process.

Following the connection of the integrated circuit die 212, the insulation layer 102 of FIG. 2 can be applied to cover the terminals 208 and the integrated circuit die 212 in an insulation layer application phase. The insulation layer application phase can include an injection, curing, heating, or cleaning process.

The integrated circuit packaging system 100 of FIG. 2 can be completed by a singulation phase which can include a cutting, sawing, etching, or laser ablation process. Optionally, the external interconnects 106 of FIG. 2 can be attached to the contact pads 104 before singulation. Singulation without attachment of the external interconnects 106 can create a land grid array (LGA) package.

Figure 14:
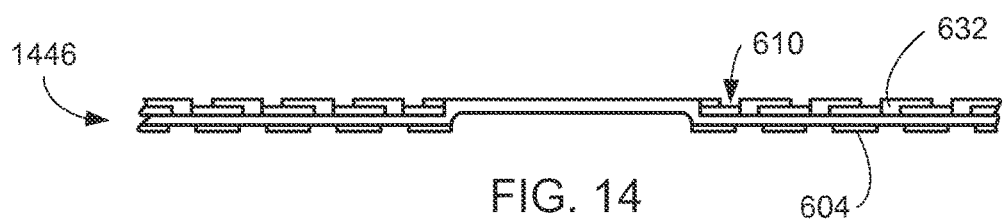
FIG. 14 is a cross-sectional view of the integrated circuit packaging system of FIG. 6 in a dielectric removal phase.

Referring now to FIG. 14, therein is shown a cross-sectional view of the integrated circuit packaging system 600 of FIG. 6 in a dielectric removal phase. A leadframe 1446 is shown having a raised side with the conductive traces 610 and a side with the contact pads 604 opposite the raised side. Portions of the side of the leadframe 1446 with the contact pads 604 can be partially removed between the contact pads 604 through a process such as etching, cutting, grinding, or laser ablation, though it is understood that this is optional; the leadframe 1446 is shown with a raised portion of the leadframe 1446 leaving space for the die mounting region 620 of FIG. 6.

An array of the contact pads 604 is arranged around the raised portion of the leadframe 1446. The contact pads 604 can be used as an etching protection layer, a diffusion barrier layer, a wet-enhancing layer, or a combination thereof.

The dielectric layer 632 is applied on the conductive traces 610 without covering the raised portion of the leadframe 1446 and patterned to expose portions of the conductive traces 610 in the dielectric removal phase. The dielectric layer removal phase can include processes such as cutting, laser ablation, grinding, or processing in conjunction with a mask.

Figure 15:
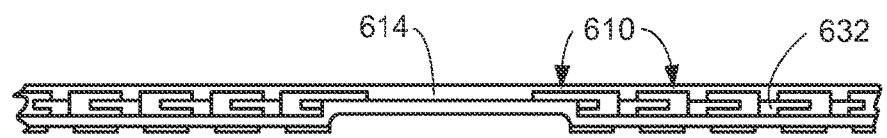
FIG. 15 is the structure of FIG. 14 in an encapsulation phase.

Referring now to FIG. 15, therein is shown the structure of FIG. 14 in an encapsulation phase. The conductive traces 610 can be extended and further routed by applying more conductive material on and through the dielectric layer 632 in an extension phase which can use a process such as sputtering, electroplating, chemical vapor deposition (CVD), or printing in conjunction with a mask.

Following the extension phase, the package body 614 can be applied on the dielectric layer 632 and the conductive traces 610 to cover the conductive traces 610 in the encapsulation phase. The encapsulation phase can include a molding, cleaning, heating, or injection process.

Figure 16:
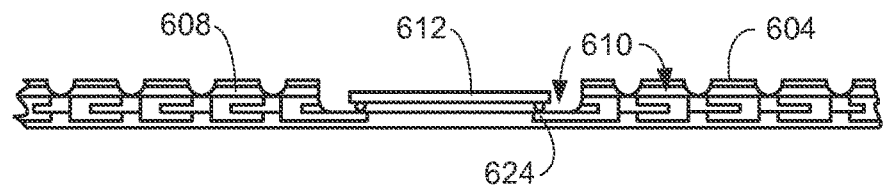
FIG. 16 is the structure of FIG. 15 in a die mounting phase.

Referring now to FIG. 16, therein is shown the structure of FIG. 15 in a die mounting phase. FIG. 16 is shown in a flipped orientation as compared to FIG. 15. A portion of the leadframe 1446 of FIG. 14 can be removed from between the contact pads 604 and from the raised area of the leadframe 1446 by a process such as etching, cutting, or laser ablation to isolate and form the terminals 608.

Following the formation of the terminals 608, the integrated circuit die 612 can be directly connected to the circuit ends 624 of the conductive traces 610 in the die mounting phase. The die mounting phase can include a reflow, heating, cleaning, or attaching process.

The insulation layer 602 of FIG. 6 can then be applied to cover the terminals 608 and the integrated circuit die 612 while leaving the contact pads 604 exposed in an insulation layer application phase. The insulation layer application phase can include an injection, curing, heating, or cleaning process.

The integrated circuit packaging system 600 of FIG. 6 can be completed by a singulation phase which can include a cutting, sawing, etching, or laser ablation process. Optionally, the external interconnects 606 of FIG. 6 can be attached to the contact pads 604 before singulation.

Figure 17:
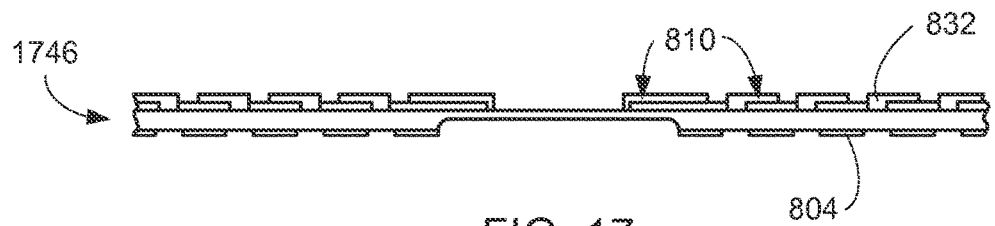
FIG. 17 is a cross-sectional view of the integrated circuit packaging system of FIG. 8 in a dielectric removal phase.

Referring now to FIG. 17, therein is shown a cross-sectional view of the integrated circuit packaging system 800 of FIG. 8 in a dielectric removal phase. A leadframe 1746 is shown having a planar side with the conductive traces 810 and a partially etched side with the contact pads 804 opposite the planar side. Portions of the side of the leadframe 1746 with the contact pads 804 can be partially removed between the contact pads 804 through a process such as etching, cutting, grinding, or laser ablation, though it is understood that this is optional; the leadframe 1746 is shown with no pre-etched portions aside from a center portion of the leadframe 1746.

An array of the contact pads 804 is arranged around the center of the leadframe 1746. The contact pads 804 can be used as an etching protection layer, a diffusion barrier layer, a wet-enhancing layer, or a combination thereof.

The dielectric layer 832 is applied on the conductive traces 810 partially extending into a center portion of the leadframe 1746 and patterned to expose portions of the conductive traces 810 in the dielectric removal phase. The dielectric removal phase can include processes such as cutting, laser ablation, grinding, or processing in conjunction with a mask.

Figure 18:
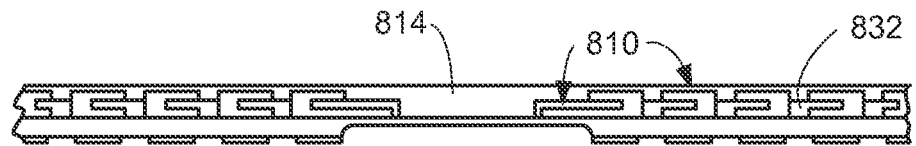
FIG. 18 is the structure of FIG. 17 in an encapsulation phase.

Referring now to FIG. 18, therein is shown the structure of FIG. 17 in an encapsulation phase. The conductive traces 810 can be extended and further routed by applying more conductive material on and through the dielectric layer 832 in an extension phase which can use a process such as sputtering, electroplating, chemical vapor deposition (CVD), or printing in conjunction with a mask.

Following the extension phase, the package body 814 can be applied on the side of the leadframe 1746 having the dielectric layer 832 and the conductive traces 810 to cover the conductive traces 810 in the encapsulation phase. The encapsulation phase can include a molding, cleaning, heating, or injection process.

Figure 19:
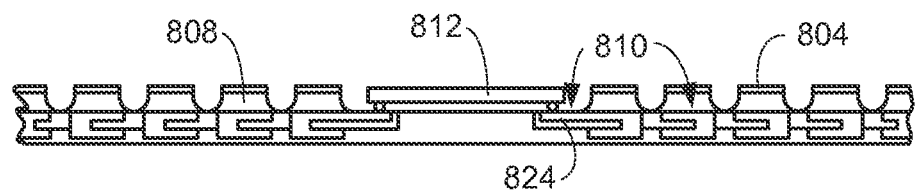
FIG. 19 is the structure of FIG. 18 in a die mounting phase.

Referring now to FIG. 19, therein is shown the structure of FIG. 18 in a die mounting phase. FIG. 19 is shown in a flipped orientation as compared to FIG. 18. A portion of the leadframe 1746 of FIG. 16 can be removed from between the contact pads 804 and from the center area of the leadframe 1746 by a process such as etching, cutting, or laser ablation to isolate and form the terminals 808.

Following the formation of the terminals 808, the integrated circuit die 812 can be directly connected to the circuit ends 824 of the conductive traces 810 in the die mounting phase. The die mounting phase can include a reflow, heating, cleaning, or attaching process.

The insulation layer 802 of FIG. 8 can then be applied to cover the terminals 808 and the integrated circuit die 812 while leaving the contact pads 804 exposed in an insulation layer application phase.

The integrated circuit packaging system 800 of FIG. 8 can be completed by a singulation phase which can include a cutting, sawing, etching, or laser ablation process. Optionally, the external interconnects 806 of FIG. 8 can be attached to the contact pads 804 before singulation.

Figure 20:
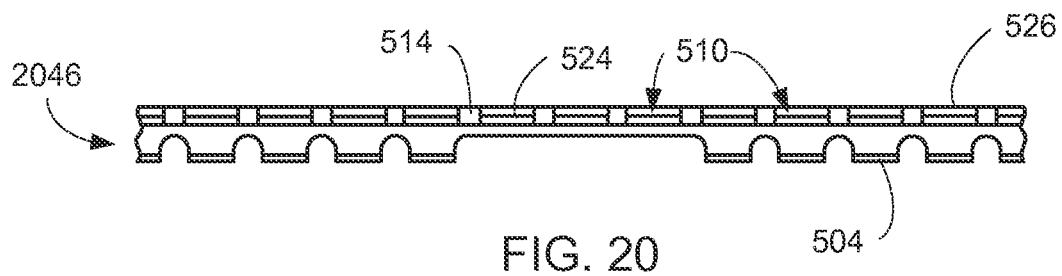
FIG. 20 is a cross-sectional view of the integrated circuit packaging system of FIG. 5 in an encapsulation phase.

Referring now to FIG. 20, therein is shown a cross-sectional view of the integrated circuit packaging system 500 of FIG. 5 in an encapsulation phase. A leadframe 2046 is shown having a planar side with the conductive traces 510 and a partially etched side with the contact pads 504 opposite the planar side. Portions of the side of the leadframe 2046 with the contact pads 504 can be partially removed between the contact pads 504 through a process such as etching, cutting, grinding, or laser ablation, though it is understood that this is optional.

An array of the contact pads 504 is arranged around the center of the leadframe 2046 where a portion of the leadframe 2046 can also be removed. The contact pads 504 can be used as an etching protection layer, a diffusion barrier layer, a wet-enhancing layer, or a combination thereof. The stacking pads 526 can be applied on the conductive traces 510 by a process such as sputtering, electroplating, chemical vapor deposition (CVD), or in conjunction with a mask.

The package body 514 can be applied on the conductive traces 510 and surround and expose the stacking pads 526 in the encapsulation phase using a process such as a molding, cleaning, heating, or injection process.

A portion of the leadframe 2046 between the contact pads 504 can be removed by a process such as etching, cutting, or laser ablation to isolate and form the terminals 508 of FIG. 5 and expose the circuit ends 524 of the conductive traces 510. Following the formation of the terminals 508, the integrated circuit die 512 of FIG. 5 having interconnects can be connected directly on the circuit ends 524 of the conductive traces 510 in a die mounting phase. The die mounting phase can include a reflow, heating, cleaning, or attaching process.

Following the connection of the integrated circuit die 512, the insulation layer 502 of FIG. 5 can be applied to cover the terminals 508 and the integrated circuit die 512 in an insulation layer application phase. The insulation layer application phase can include an injection, curing, heating, or cleaning process.

The integrated circuit packaging system 500 of FIG. 5 can be completed by a singulation phase which can include a cutting, sawing, etching, or laser ablation process. Optionally, the external interconnects 506 of FIG. 5 can be attached to the contact pads 504 before singulation. Singulation without attachment of the external interconnects 506 can create a land grid array (LGA) package.

Figure 21:
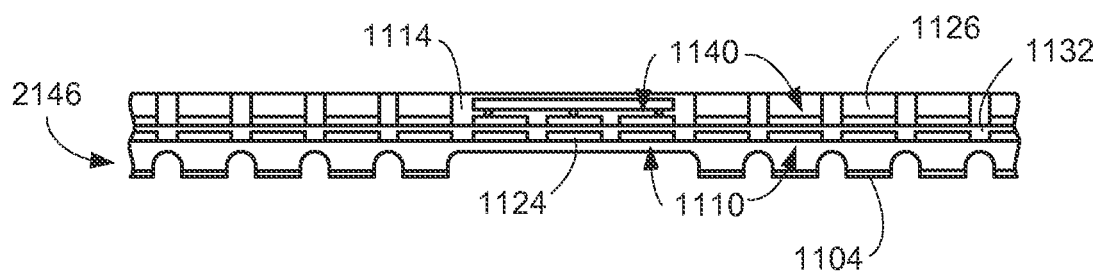
FIG. 21 is a cross-sectional view of the integrated circuit packaging system of FIG. 11 in an encapsulation phase.

Referring now to FIG. 21, therein is shown a cross-sectional view of the integrated circuit packaging system 1100 of FIG. 11 in an encapsulation phase. A leadframe 2146 is shown having a planar side with the first conductive traces 1110 and a partially etched side with the contact pads 1104 opposite the planar side. Portions of the side of the leadframe 2146 with the contact pads 1104 can be partially removed between the contact pads 1104 through a process such as etching, cutting, grinding, or laser ablation, though it is understood that this is optional; the leadframe 2146 is shown with a portion of the leadframe 2146 removed from between the contact pads 1104, including a center of the leadframe 2146.

An array of the contact pads 1104 is arranged around the center of the leadframe 2146. The contact pads 1104 can be used as an etching protection layer, a diffusion barrier layer, a wet-enhancing layer, or a combination thereof. A full array of the first circuit ends 1124 of the first conductive traces 1110 are formed on the center portion of the leadframe 2146.

The dielectric layer 1132 is applied on the first conductive traces 1110 and can be patterned to expose portions of the first conductive traces 1110 in a dielectric removal phase. The dielectric layer removal phase can include processes such as cutting, laser ablation, grinding, or processing in conjunction with a mask.

The first conductive traces 1110 can be further routed by applying more conductive material on and through the dielectric layer 1132 to form the second conductive traces 1140 and the stacking pads 1126 in an extension phase which can use a process such as sputtering, electroplating, chemical vapor deposition (CVD), or printing in conjunction with a mask.

Following the extension phase, an additional integrated circuit die 1134 can be attached to the second conductive traces 1140 and the package body 1114 can be applied on the additional integrated circuit die 1134, the dielectric layer 1132, and around the stacking pads 1126 while leaving the stacking pads 1126 exposed in the encapsulation phase. The encapsulation phase can include a molding, cleaning, heating, or injection process.

A portion of the leadframe 2146 of FIG. 14 can be removed from between the contact pads 1104 and from the raised area of the leadframe 2146 by a process such as etching, cutting, or laser ablation to isolate and form the terminals 1108 of FIG. 11.

Following the formation of the terminals 1108, the integrated circuit die 1112 of FIG. 11 can be directly connected to the first circuit ends 1124 of the first conductive traces 1110 in a die mounting phase. The die mounting phase can include a reflow, heating, cleaning, or attaching process.

The insulation layer 1102 of FIG. 11 can then be applied to cover the terminals 1108 and the integrated circuit die 1112 while leaving the contact pads 1104 exposed in an insulation layer application phase. The insulation layer application phase can include an injection, curing, heating, or cleaning process.

The integrated circuit packaging system 1100 of FIG. 11 can be completed by a singulation phase which can include a cutting, sawing, etching, or laser ablation process. Optionally, the external interconnects 1106 of FIG. 11 can be attached to the contact pads 1104 before singulation.

Figure 22:
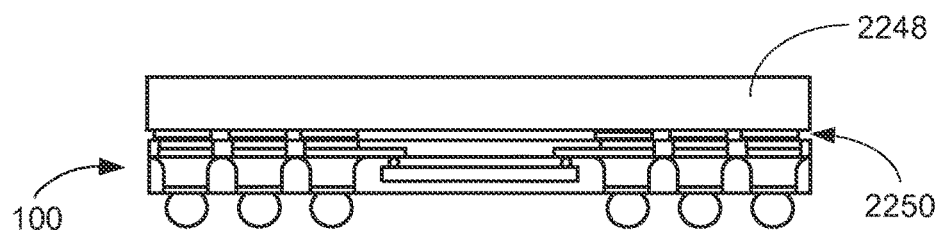
FIG. 22 is the integrated circuit packaging system of FIG. 1 in a stacked configuration.

Referring now to FIG. 22, therein is shown the integrated circuit packaging system 100 of FIG. 1 in a stacked configuration. A component 2248 is shown in a stacked configuration with the integrated circuit packaging system 100, which is the same as the integrated circuit packaging system 100 fully described in the description of FIGS. 1 and 2. The component 2248 is electrically connected to and stacked on the integrated circuit packaging system 100 with a connection layer 2250, which can be any conductive material.

The component 2248 can be any active or passive device, including devices that allow for further stacking. For example, the component 2248 can be another of the integrated circuit packaging system 100, the integrated circuit packaging system 300, the integrated circuit packaging system 400, the integrated circuit packaging system 500, or the integrated circuit packaging system 600. As further examples, the component 2248 can be the integrated circuit packaging system 700, the integrated circuit packaging system 800, the integrated circuit packaging system 900, the integrated circuit packaging system 1000, or the integrated circuit packaging system 1100.

Figure 23:
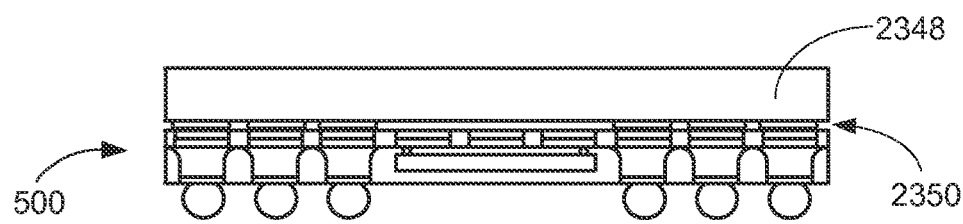
FIG. 23 is the integrated circuit packaging system of FIG. 5 in a stacked configuration.

Referring now to FIG. 23, therein is shown the integrated circuit packaging system 500 of FIG. 5 in a stacked configuration. A component 2348 is shown in a stacked configuration with the integrated circuit packaging system 500, which is the same as the integrated circuit packaging system 500 fully described in the description of FIG. 5. The component 2348 is electrically connected to and stacked on the integrated circuit packaging system 500 with a connection layer 2350, which can be any conductive material.

The component 2348 can be any active or passive device, including devices that allow for further stacking. For example, the component 2348 can be the integrated circuit packaging system 100, the integrated circuit packaging system 300, the integrated circuit packaging system 400, another of the integrated circuit packaging system 500, or the integrated circuit packaging system 600. As further examples, the component 2348 can be the integrated circuit packaging system 700, the integrated circuit packaging system 800, the integrated circuit packaging system 900, the integrated circuit packaging system 1000, or the integrated circuit packaging system 1100.

Figure 24:
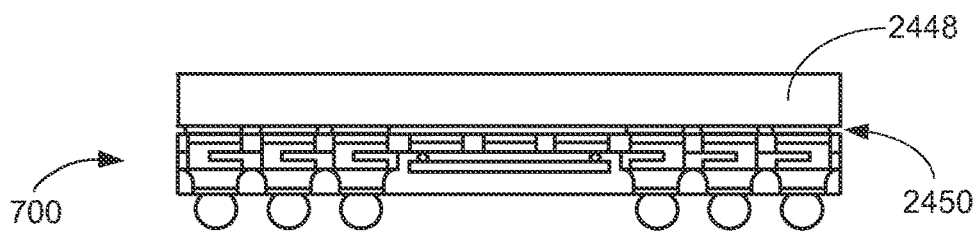
FIG. 24 is the integrated circuit packaging system of FIG. 7 in a stacked configuration.

Referring now to FIG. 24, therein is shown the integrated circuit packaging system 700 of FIG. 7 in a stacked configuration. A component 2448 is shown in a stacked configuration with the integrated circuit packaging system 700, which is the same as the integrated circuit packaging system 700 fully described in the description of FIG. 7. The component 2448 is electrically connected to and stacked on the integrated circuit packaging system 700 with a connection layer 2450, which can be any conductive material.

The component 2448 can be any active or passive device, including devices that allow for further stacking. For example, the component 2448 can be the integrated circuit packaging system 100, the integrated circuit packaging system 300, the integrated circuit packaging system 400, the integrated circuit packaging system 500, or the integrated circuit packaging system 600. As further examples, the component 2448 can be another of the integrated circuit packaging system 700, the integrated circuit packaging system 800, the integrated circuit packaging system 900, the integrated circuit packaging system 1000, or the integrated circuit packaging system 1100.

Figure 25:
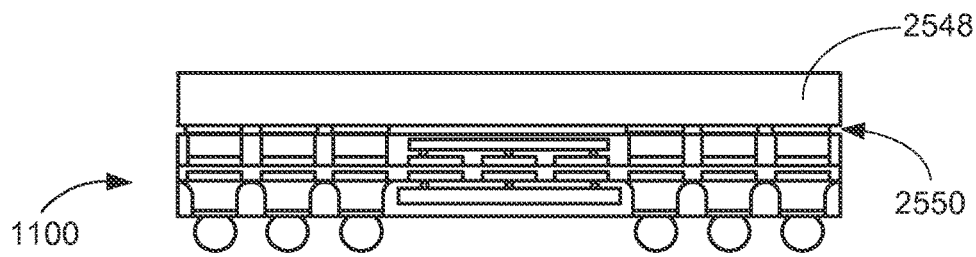
FIG. 25 is the integrated circuit packaging system of FIG. 11 in a stacked configuration.

Referring now to FIG. 25, therein is shown the integrated circuit packaging system 1100 of FIG. 11 in a stacked configuration. A component 2548 is shown in a stacked configuration with the integrated circuit packaging system 1100, which is the same as the integrated circuit packaging system 1100 fully described in the description of FIG. 11. The component 2548 is electrically connected to and stacked on the integrated circuit packaging system 1100 with a connection layer 2550, which can be any conductive material.

The component 2548 can be any active or passive device, including devices that allow for further stacking. For example, the component 2548 can be the integrated circuit packaging system 100, the integrated circuit packaging system 300, the integrated circuit packaging system 400, the integrated circuit packaging system 500, or the integrated circuit packaging system 600. As further examples, the component 2548 can be the integrated circuit packaging system 700, the integrated circuit packaging system 800, the integrated circuit packaging system 900, the integrated circuit packaging system 1000, or another of the integrated circuit packaging system 1100.

Figure 26:
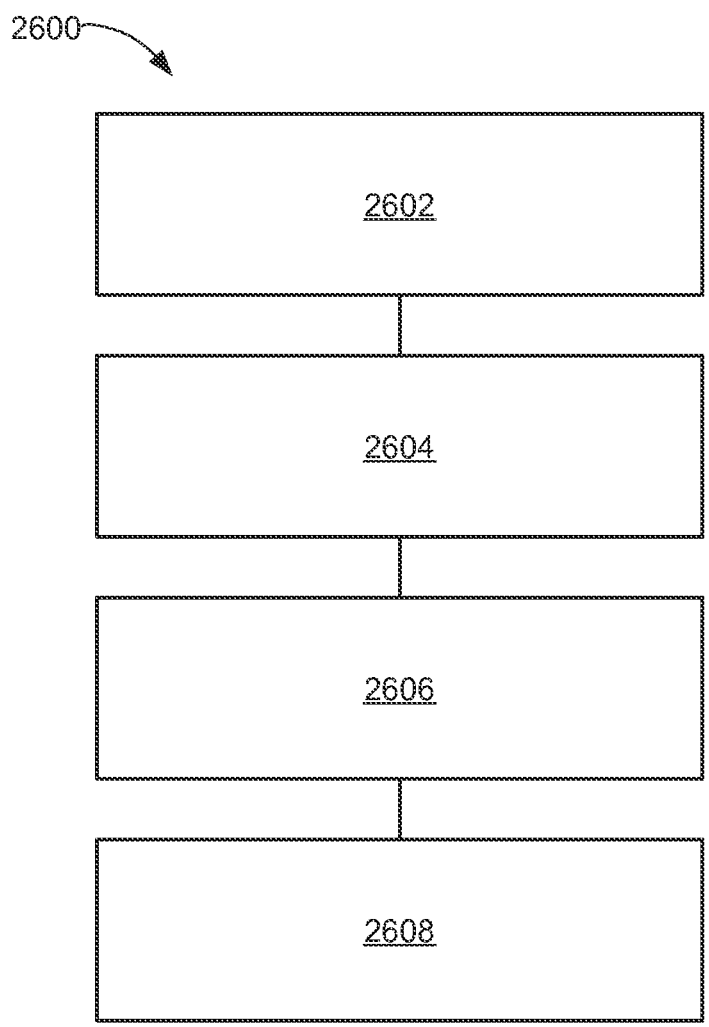
FIG. 26 is a flow chart of a method of manufacture of the integrated circuit packaging system in a further embodiment of the present invention.

Referring now to FIG. 26, therein is shown a flow chart of a method 2600 of manufacture of the integrated circuit packaging system in a further embodiment of the present invention. The method 2600 includes: forming a conductive trace having a terminal end and a circuit end in a block 2602; forming a terminal on the terminal end in a block 2604; connecting an integrated circuit die directly on the circuit end of the conductive trace, the integrated circuit die laterally offset from the terminal, the active side of the integrated circuit die facing the circuit end in a block 2606; and forming an insulation layer on the terminal and the integrated circuit die, the integrated circuit die covered by the insulation layer in a block 2608.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a conductive trace having a terminal end and a circuit end, the conductive trace, the terminal end, and the circuit end having identical and uniform physical and chemical properties;
   forming a terminal on the terminal end;
   connecting an integrated circuit die having interconnects directly on the circuit end of the conductive trace, the integrated circuit die laterally offset from the terminal, the active side of the integrated circuit die facing the circuit end;
   forming an insulation layer directly on the terminal and the integrated circuit die, the integrated circuit die covered by the insulation layer, the interconnects of the integrated circuit die in direct contact with only the circuit end of the conductive trace and the insulation layer; and
   forming a package body on the insulation layer and the conductive trace, the package body having a concave surface between the terminal and another terminal with the concave surface having the characteristics of an etching process.

2. The method as claimed in claim 1 further comprising forming a stacking pad on the conductive trace opposite the terminal.

3. The method as claimed in claim 1 wherein connecting the integrated circuit die includes connecting an array of a plurality of the circuit end of the conductive trace directly on the active side of the integrated circuit die.

4. The method as claimed in claim 1 further comprising forming a stacking pad directly on the conductive trace with the stacking pad exposed from the package body.

5. The method as claimed in claim 1 wherein connecting the integrated circuit die includes connecting a plurality of the circuit end of the conductive trace directly on a perimeter of the active side of the integrated circuit die.

6. A method of manufacture of an integrated circuit packaging system comprising:
   forming a conductive trace having a terminal end and a circuit end, the conductive trace, the terminal end, and the circuit end having identical and uniform physical and chemical properties;
   forming a terminal on the terminal end;
   connecting an integrated circuit die having interconnects directly on the circuit end of the conductive trace, the integrated circuit die laterally offset from the terminal, the active side of the integrated circuit die facing the circuit end; and
   forming an insulation layer directly on the terminal and the integrated circuit die, the integrated circuit die covered by the insulation layer, the interconnects of the integrated circuit die in direct contact with only the circuit end of the conductive trace and the insulation layer; and
   forming a package body on the insulation layer and the conductive trace, the package body having a concave surface between the terminal and another terminal with the concave surface having the characteristics of an etching process.

7. The method as claimed in claim 6 further comprising connecting an additional integrated circuit die to the circuit end of the conductive trace.

8. The method as claimed in claim 6 further comprising:
   forming a stacking pad on the terminal end of the conductive trace, the stacking pad exposed through the package body; and
   forming another of the stacking pad on the circuit end of the conductive trace.

9. The method as claimed in claim 6 wherein forming the conductive trace includes forming the conductive trace as a two layer structure with a dielectric layer separating layers of the two layer structure.

10. The method as claimed in claim 6 further comprising attaching an external interconnect to the terminal.

11. An integrated circuit packaging system comprising:
    a conductive trace having a terminal end and a circuit end, the conductive trace, the terminal end, and the circuit end having identical and uniform physical and chemical properties;
    a terminal on the terminal end;
    an integrated circuit die having interconnects directly on the circuit end of the conductive trace, the integrated circuit die laterally offset from the terminal, the active side of the integrated circuit die facing the circuit end;
    an insulation layer directly on the terminal and the integrated circuit die, the integrated circuit die covered by the insulation layer, the interconnects of the integrated circuit die in direct contact with only the circuit end of the conductive trace and the insulation layer; and
    a package body on the insulation layer and the conductive trace, the package body having a concave surface between the terminal and another terminal with the concave surface having the characteristics of an etching process.

12. The system as claimed in claim 11 further comprising a stacking pad on the conductive trace opposite the terminal.

13. The system as claimed in claim 11 further comprising an array of a plurality of the circuit end of the conductive trace directly on the active side of the integrated circuit die.

14. The system as claimed in claim 11 further comprising a stacking pad directly on the conductive trace with the stacking pad exposed from the package body.

15. The system as claimed in claim 11 further comprising a plurality of the circuit end of the conductive trace directly on a perimeter of the active side of the integrated circuit die.

16. The system as claimed in claim 11 further comprising:
    a package body on the conductive trace; and
    wherein:
        the terminal includes an external terminal surface opposite an internal terminal surface, the internal terminal surface on the terminal end.

17. The system as claimed in claim 16 further comprising an additional integrated circuit die connected to the circuit end of the conductive trace.

18. The system as claimed in claim 16 further comprising:
    a stacking pad on the terminal end of the conductive trace, the stacking pad exposed through the package body; and
    another of the stacking pad on the circuit end of the conductive trace.

19. The system as claimed in claim 16 wherein the conductive trace is a two layer structure with a dielectric layer separating layers of the two layer structure.

20. The system as claimed in claim 16 further comprising an external interconnect attached to the terminal.

* * * * *